United States Patent
Yang et al.

(10) Patent No.: US 10,388,371 B2
(45) Date of Patent: Aug. 20, 2019

(54) MEMORY CELL SELECTOR AND METHOD OF OPERATING MEMORY CELL

(71) Applicant: Agency for Science, Technology and Research, Singapore (SG)

(72) Inventors: Hongxin Yang, Singapore (SG); Minghua Li, Singapore (SG); Wei He, Singapore (SG); Yu Jiang, Singapore (SG); Fei Li, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 15/543,923

(22) PCT Filed: Jan. 26, 2016

(86) PCT No.: PCT/SG2016/050035
§ 371 (c)(1),
(2) Date: Jul. 14, 2017

(87) PCT Pub. No.: WO2016/122406
PCT Pub. Date: Aug. 4, 2016

(65) Prior Publication Data
US 2018/0012652 A1   Jan. 11, 2018

(30) Foreign Application Priority Data

Jan. 26, 2015   (SG) .......................... 10201500602R

(51) Int. Cl.
*G11C 13/00* (2006.01)
*H01L 45/00* (2006.01)
*H01L 27/24* (2006.01)

(52) U.S. Cl.
CPC .......... *G11C 13/003* (2013.01); *G11C 13/004* (2013.01); *G11C 13/0021* (2013.01);
(Continued)

(58) Field of Classification Search
None
See application file for complete search history.

(56) References Cited

U.S. PATENT DOCUMENTS 7,056,762 B2    6/2006  Moore et al.
9,659,998 B1 *  5/2017  Lung ................... H01L 27/2481
(Continued)

FOREIGN PATENT DOCUMENTS

KR      10-1457812 B1    11/2014

OTHER PUBLICATIONS

Chen et al., "An Access-Transistor-Free (0T/1R) Non-Volatile Resistance Random Access Memory (RRAM) Using a Novel Threshold Switching, Self-Rectifying Chalcogenide Device," Macronix, IEDM, 2003, pp. 905-908.
(Continued)

*Primary Examiner* — Douglas King
(74) *Attorney, Agent, or Firm* — Winstead, P.C.

(57) ABSTRACT

Embodiments provide a selector device for selecting a memory cell. The selector device includes a first electrode; a second electrode; and a switching layer sandwiched between the first electrode and the second electrode. The switching layer includes at least one metal rich layer and at least one chalcogenide rich layer. The metal rich layer includes at least one of a metal or a metal compound, wherein metal content of the metal rich layer is greater than 50 at. %. The chalcogenide content of the chalcogenide rich layer is greater than 50 at. %.

8 Claims, 24 Drawing Sheets

(52) U.S. Cl.
CPC ...... *G11C 13/0038* (2013.01); *G11C 13/0069* (2013.01); *H01L 27/2409* (2013.01); *H01L 45/085* (2013.01); *H01L 45/1233* (2013.01); *H01L 45/141* (2013.01); *H01L 45/142* (2013.01); *H01L 45/143* (2013.01); *H01L 45/144* (2013.01); *H01L 45/145* (2013.01); *G11C 2013/0052* (2013.01); *G11C 2013/0092* (2013.01); *G11C 2213/15* (2013.01); *G11C 2213/76* (2013.01); *H01L 27/2418* (2013.01)

(56) References Cited

U.S. PATENT DOCUMENTS

| | | | |
|---|---|---|---|
| 2004/0042259 A1* | 3/2004 | Campbell | G11C 13/0004 365/158 |
| 2006/0035403 A1* | 2/2006 | Campbell | H01L 45/085 438/95 |
| 2006/0221678 A1 | 10/2006 | Bedeschi et al. | |
| 2006/0250856 A1 | 11/2006 | Bertin et al. | |
| 2007/0007506 A1* | 1/2007 | Campbell | G11C 13/0011 257/2 |
| 2007/0023744 A1* | 2/2007 | Campbell | H01L 45/085 257/4 |
| 2007/0108431 A1 | 5/2007 | Chen et al. | |
| 2008/0180990 A1 | 7/2008 | Lung | |
| 2009/0231910 A1 | 9/2009 | Liu et al. | |
| 2012/0037873 A1 | 2/2012 | Ikarashi et al. | |
| 2015/0048299 A1 | 2/2015 | Hwang et al. | |

OTHER PUBLICATIONS

Lee et al., "Highly-Scalable Threshold Switching Select Device based on Chaclogenide Glasses for 3D Nanoscaled Memory Arrays," IEDM, 2013, pp. 33-35.

International Preliminary Report on Patentability for International Application No. PCT/SG2016/050035 dated Jul. 28, 2016, pp. 1-24.

Aluguri et al., "Overview of Selector Devices for 3-D Stackable Cross Point RRAM Arrays," Journal of the Electron Devices Society, vol. 4, No. 5, Sep. 2016, pp. 294-306.

An Chen, "A Review of Emerging Non-Volatile Memory (NVM) Technologies and Applications," Solid-State Electronics, vol. 125, 2016, pp. 25-38.

Meena et al., "Overview of Emerging Nonvolatile Memory Technologies," Nanoscale Research Letters, vol. 9, 2014, pp. 1-33.

* cited by examiner

510

520

530    508

MEMORY CELL SELECTOR AND METHOD OF OPERATING MEMORY CELL

CROSS-REFERENCE TO RELATED APPLICATIONS

The present application claims the benefit of the Singapore patent application No. 10201500602R filed on 26 Jan. 2015, the entire contents of which are incorporated herein by reference for all purposes.

TECHNICAL FIELD

Embodiments relate generally to memory devices, and in particular, relate to a memory selector and a method of operating a memory cell.

BACKGROUND

Consumer electronics requires low power-consumption and high density non-volatile memory. In order to eliminate the sneak path and reduce the power consumption, a selector device is needed for each memory cell, for example, resistive random access memory (RRAM) cell.

Currently, there are several candidate selector devices available, such as Ovonic Threshold Switch (OTS), Mott effect switch based selector devices ($NbO_2$ and $VO_2$), and Mixed-Ionic-Electronic-Conduction (MIEC) material based selector devices. MIEC based selector device and OTS show overlapping curves between the forward voltage sweep and backward voltage sweep. A partial reset might occur because of the voltage-drop competition between the selector device and the memory device. Furthermore, the read voltage and set/reset voltage are required to be greater than the switching voltage of the selector device, which will result in high power consumption. In order to overcome these issues, a selector device with a low on-state holding voltage ($V_{hold}$) is desired. Mott effect selector devices exhibit this holding voltage effect, but the hysteresis window is not big enough and also shows a high half-select leakage current. As the size of a memory cell array increases, large amount of leakage current exists, which will cause high power consumption and constraint the development of higher density memory cell array. Accordingly, it is desired to lower the sneak current.

It is desired to provide high performance selectors for a memory device.

SUMMARY

Various embodiments provide a selector device for selecting a memory cell. The selector device includes a first electrode; a second electrode; and a switching layer sandwiched between the first electrode and the second electrode. The switching layer includes at least one metal rich layer and at least one chalcogenide rich layer. The metal rich layer includes at least one of a metal or a metal compound, wherein metal content of the metal rich layer is greater than 50 at. %. The chalcogenide content of the chalcogenide rich layer is greater than 50 at. %.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized, and structural and logical changes may be made without departing from the scope of the invention. The various embodiments are not necessarily mutually exclusive, as some embodiments can be combined with one or more other embodiments to form new embodiments.

Figure 1:
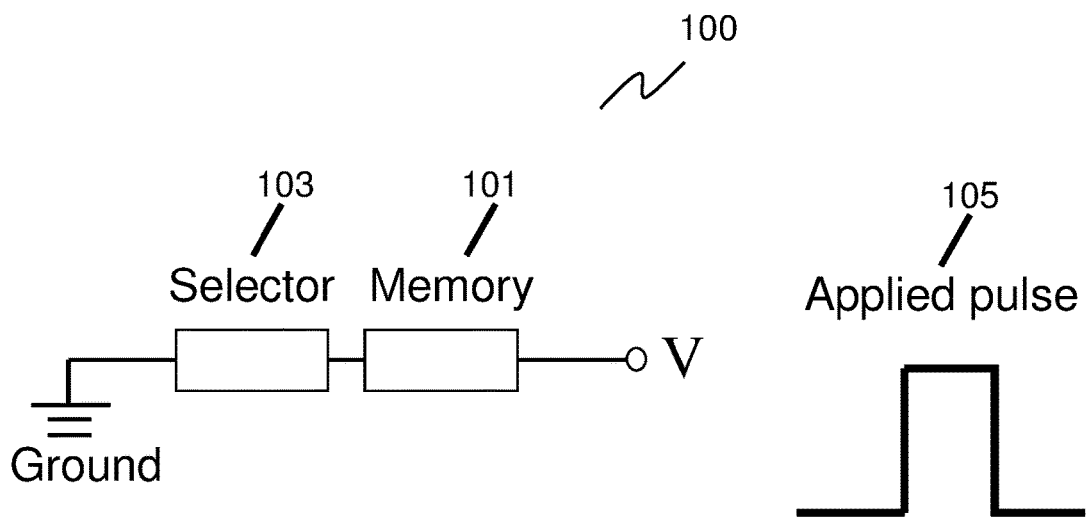
FIG. 1 shows a block diagram illustrating a memory device.

FIG. 1 shows a block diagram illustrating a memory device 100, including a memory 101, and a selector 103 connected to the memory 101 in series. When an applied voltage pulse $V_{Applied}$ 105 is greater than a threshold voltage $V_{th}$, the selector 103 is switched on, e.g., to a low-resistance state. Then the resistance of the selector will decrease and the voltage on the selector 103 will decrease. If the voltage on the selector 103 is lower than the threshold voltage $V_{th}$, the selector 103 is switches off while a partial reset might occur for the memory 101. Voltage-drop competition between the selector 103 and the memory 101 exists.

Figure 2:
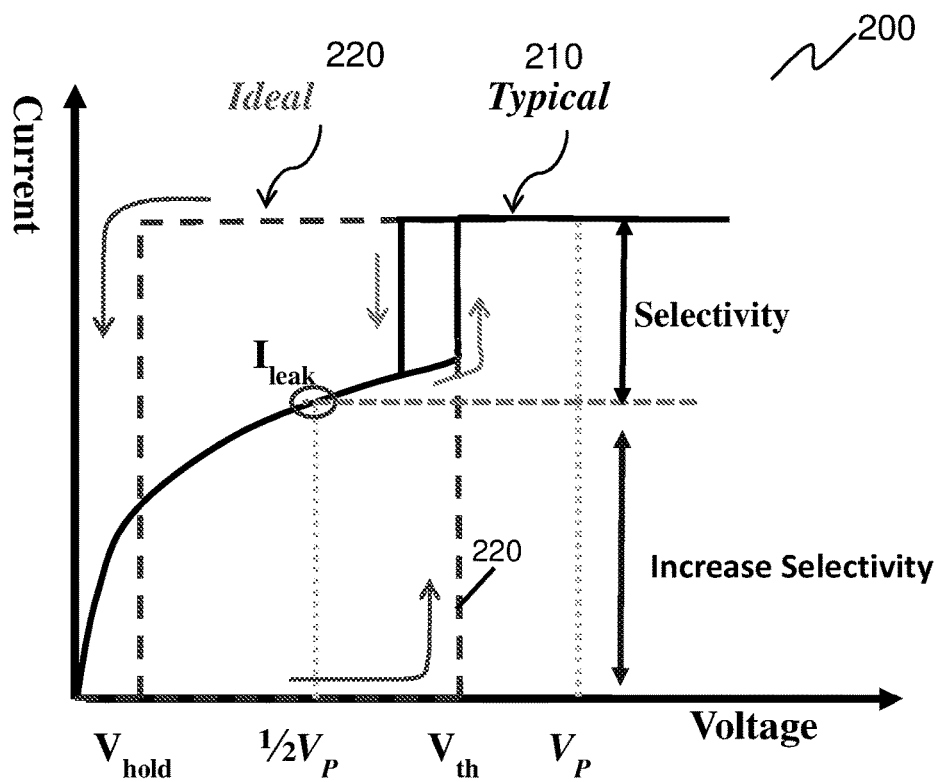
FIG. 2 shows a schematic diagram illustrating current-voltage (IV) curves of a typical and an ideal selector.

FIG. 2 shows a schematic diagram 200 illustrating current-voltage (IV) curves of a typical selector 210 (in solid line) and an ideal selector 220 (in dash line). In FIG. 2, $V_{hold}$ represents a holding voltage of the selector, and $V_{th}$ represents a threshold voltage of the selector. $V_p$ represents a programming voltage, e.g., a set voltage, and $½V_p$ represents a half-select voltage applied on the non-selected memory cells. Compared to the typical selector 210, an ideal selector 220 is desired to have low leakage current, low holding voltage $V_{hold}$, fast turn-on speed, and large hysteresis window. As shown in FIG. 2, when the voltage reaches the threshold voltage $V_{th}$, the selector is switched on to a low-resistance state. When the voltage drops below the holding voltage $V_{hold}$, the selector is switched off to a high-resistance state. The IV curve 220 of the ideal selector shows a sharp transition.

In various embodiments, a selector device with desired properties, such as low holding voltage, large on/off ratio, low off-state leakage current, fast turn-on speed, high on-current density, and high cycling endurance, is provided. The selector device may be a metal-insulator-metal (MIM) structure with two metal electrodes sandwiching an insulating switching material, wherein the switching material may include at least one metal rich layer and at least one chalcogenide rich layer. Based on the low holding voltage of the selector, an operation scheme is proposed to reduce the power consumption and loose the constraint on the selection of memory cells.

Figure 3:
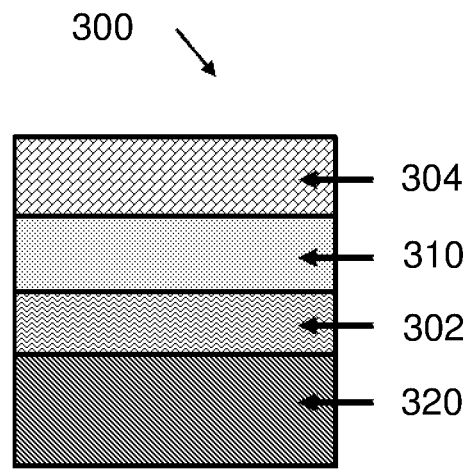
FIG. 3 shows a cross-sectional view of a selector device for selecting a memory cell according to various embodiments.
Figure 4:
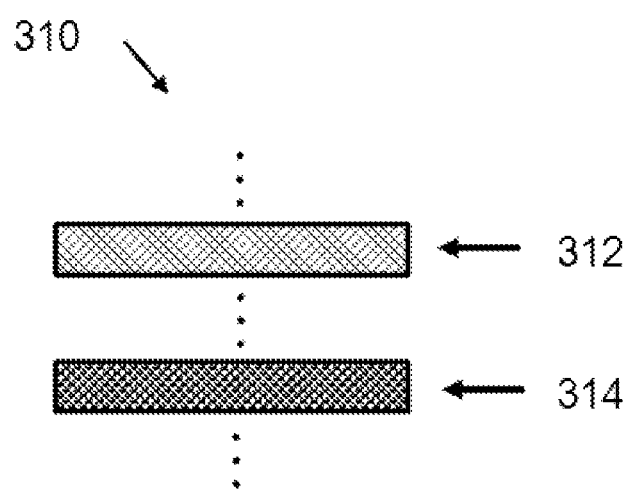
FIG. 4 shows a switching layer of a selector device according to various embodiments.

FIG. 3 shows a cross-sectional view of a selector device 300 for selecting a memory cell according to various embodiments. The selector device 300 includes a first electrode 302; a second electrode 304; and a switching layer 310 sandwiched between the first electrode 302 and the second electrode 304. As shown in FIG. 4 below, the switching layer 310 includes at least one metal rich layer 312 and at least one chalcogenide rich layer 314. The metal rich layer 312 includes at least one of a metal or a metal compound, wherein metal content of the metal rich layer 312 is greater than 50 at. % (atomic percentage). The chalcogenide content of the chalcogenide rich layer 314 is greater than 50 at. %.

In this context, the metal rich layer 312 refers to a layer including metal elements, in which the metal content is greater than 50 at. % so that the metal elements are the majority elements in the metal rich layer 312. In this context, the chalcogenide rich layer 314 refers to a layer of chalcogenide, or a layer of mixture including chalcogenide, in which the chalcogenide content is greater than 50 at. % so that the chalcogenides are the majority compounds in the chalcogenide rich layer. In various embodiments, the chalcogenide rich layer 314 may include a mixture of chalcogenide and other dielectric or metal materials, in which chalcogenide content is greater than 50 at. %, higher than the other dielectric or metal content. Examples of dielectric or metal material that may be included in the chalcogenide rich layer 314 may include but are not limited to $Al_2O_3$, $SiO_2$, $Si_3N_4$, Ag, Cu, and Zn. A chalcogenide includes chalcogen elements, wherein examples of chalcogen elements include oxygen (O), sulfur (S), selenium (Se), and tellurium (Te). In this context, the metal rich layer 312 is a different layer from the chalcogenide rich layer 314, in that the two layers 312, 314 may have different materials, different element composition, or different atomic percentages of various element components. In other words, the material composition or the element composition of the metal rich layer 312 is different from that of the chalcogenide rich layer 314.

Figure 7A:
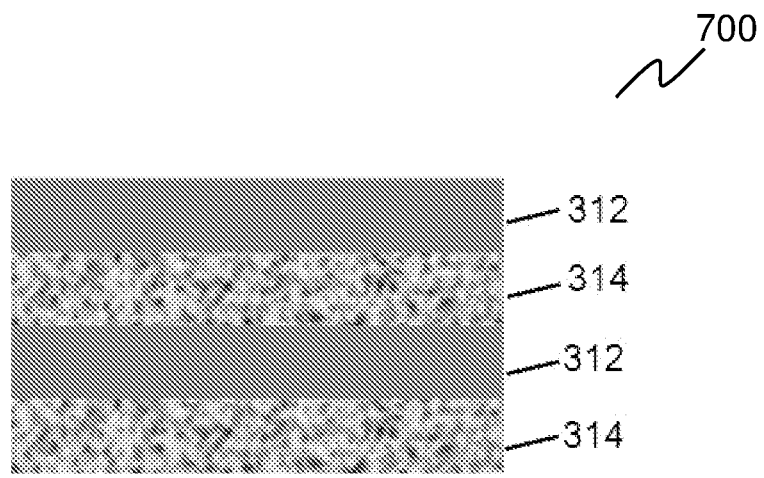
FIG. 7A shows a switching layer of a selector device according to various embodiments.

In various embodiments, the switching layer 310 may include a plurality of metal rich layers 312 and a plurality of chalcogenide rich layers 314, wherein the metal rich layers 312 and the chalcogenide rich layers 314 may be arranged alternately. In various embodiments, the switching layer 310 may include a plurality of metal rich layers arranged in at least one metal rich layer stack and a plurality of chalcogenide rich layers arranged in at least one chalcogenide rich layer stack, wherein the metal rich layer stack and the chalcogenide rich layer stack may be arranged alternately, as shown in FIG. 7A below.

In various embodiments, the switching layer 310 may have a symmetric structure or an asymmetric structure. In a symmetric structure, the number of metal rich layers 312 is an odd number m, and the number of chalcogenide rich layers 314 is an even number n bigger than the odd number m by 1 such that the n chalcogenide rich layers 314 and the m−1 metal rich layers are arranged alternately and symmetrically at both sides of a metal rich layer in the center, and vice versa. By way of example, denoting the metal rich layer as layer A and denoting the chalcogenide rich layer as layer B, a symmetric structure of the switching layer 310 may be BAB, BABAB, ABA, ABABA, etc. In an asymmetric structure, the number of metal rich layers 312 may be the same as the number of chalcogenide rich layers 314, in which the metal rich layer 312 alternates with the chalcogenide rich layer 314. By way of example, an asymmetric structure of the switching layer 310 may be AB, BA, ABAB, BABA, ABABAB, BABABA, etc.

In various embodiments, each of the metal rich layer and the chalcogenide rich layer has a thickness in a range of 1 nm-20 nm.

In various embodiments, the selector device 300 may optionally include a substrate 320, on which the first electrode 302, the second electrode 304 and the switching layer 310 are mounted.

Figure 5A:
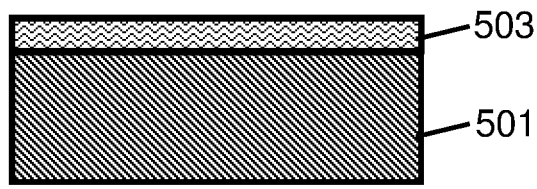
FIG. 5A shows a structure after a pattern and bottom electrode deposition process according to various embodiments.
Figure 5B:
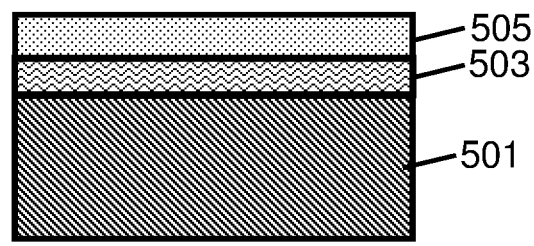
FIG. 5B shows a structure after a pattern and switching layer deposition process according to various embodiments.
Figure 5C:
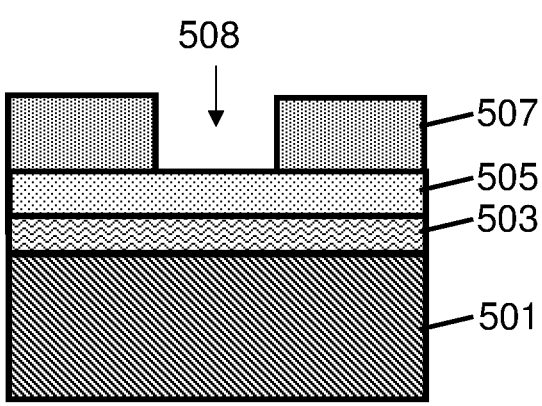
FIG. 5C shows a structure after a pattern and dielectric layer deposition process according to various embodiments.
Figure 5D:
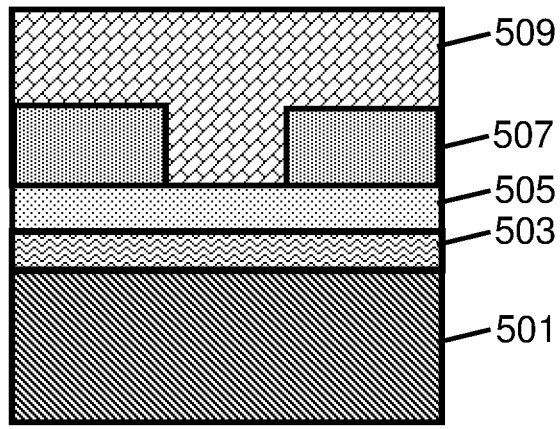
FIG. 5D shows a structure after a pattern and top electrode deposition process according to various embodiments.
Figure 6:
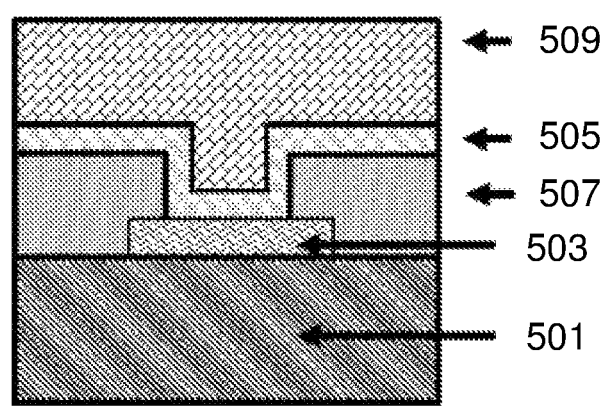
FIG. 6 shows a selector device according to various embodiments according to various embodiments.

The first electrode 302 and the second electrode 304 may be symmetric as show in FIG. 3, or may be asymmetric as shown in FIG. 5D and FIG. 6 below. The electrodes 302, 304 may include any conductive materials, such as platinum (Pt), titanium (Ti), tungsten (W), aluminum (Al), copper (Cu), Indium Tin Oxide (ITO), gold (Au), silver (Ag), polysilicon or any other suitable conductive material.

In various embodiments, by proper selection of materials for the electrodes 302, 304 and the asymmetric or symmetric layer structure of switching layer 310, a diode like selector device or a bidirectional selector device can be realized separately. For example, by selecting the same type of materials as electrodes 302, 304 and using the symmetric layer structure of switching layer, a bi-directional selector device may be formed. In other cases, the selector device may behave as a diode-like selector.

In various embodiments, the metal rich layer 312 may include a material of metal compound. Examples of the metal compound may include but is not limited to silver telluride, silver selenide, silver sulfide, copper telluride, copper selenide, copper sulfide, or any combination thereof. Any other suitable metal compound may be used in the metal rich layer 312. When the metal rich layer 312 includes the material of metal compound, the metal content in the metal compound is greater than 50 at. %.

In various embodiments, the metal rich layer 312 may include a metal material. Examples of the metal material may include but is not limited to silver (Ag), copper (Cu), platinum (Pt), zinc (Zn), gold (Au), ruthenium (Ru), lithium (Li), or any combination thereof. In various embodiments of the metal rich layer 312 including the metal material, the metal content of the metal rich layer is substantially equal to 100 at. %. In various embodiments, the metal material of the metal rich layer 312 is different from the material of the first electrode 302 and the material of the second electrode 304. For example, the metal rich layer 312 includes a metal element which is able to diffuse fast into the chalcogenide rich layer 314. Examples of materials for such a metal rich layer 312 may include Zn, Cu, Ag, $Cu_2Se$, or $Ag_2S$. The electrodes 302, 304 may include a metal or another conductive material which is able to prevent the switching materials of layers 312, 314 from diffusing out into the electrodes 302, 304. Examples of materials for such electrodes 312, 314 may include TiN, TaN, Pt, or W.

In various embodiments, the metal or metal compound material included in the metal rich layer 312 is selected to be a material, such as Ag, Cu, Zn and the compounds thereof, which has good conductivity, e.g., conductivity of higher than 10E-4 $Scm^{-1}$, and fast ion diffusion speed, e.g., diffusivity of higher than 10E-12 $cm^2s^{-1}$.

In various embodiments, the chalcogenide rich layer 314 includes a metalloid chalcogenide formed from at least one chalcogen element and at least one metalloid element. Examples of the metalloid chalcogenide include germanium telluride, antimony telluride, germanium antimony telluride, germanium selenide, germanium sulfide, germanium oxide, germanium antimony, antimony sulfide, or any combination thereof.

In various embodiments, the chalcogenide rich layer 314 includes a metal chalcogenide formed from at least one chalcogen element and at least one metal element. In other words, the metal chalcogenide may be a binary compound between the metal element (e.g., Ag, Cu, etc.) and the chalcogen element (e.g., Se, Te, etc.) Examples of the metal chalcogenide include silver telluride (AgTe), silver selenide (AgSe), silver sulfide (AgS), copper telluride (CuTe), copper selenide (CuSe), copper sulfide (CuS), or any combination thereof.

In various embodiments, the material of the chalcogenide rich layer 314 may be any types of mixture including chalcogenide materials and other suitable dielectric or metal material, in which the chalcogenide content is greater than 50 at. %. In various embodiments, the material included in the chalcogenide rich layer 314 is selected to be a material having less conductivity and high solubility of ion, such as oxides, sulphides, selenides and tellurides, or the mixture thereof. For example, one or more of $GeTe_x$, $GeS_x$, $GeO_x$, $GeSe_x$, $GeSb_x$, $SbTe_x$, $SbS_x$, $GeSbTe_x$, $GeSbTe_x$-$SiO_2$ may be included in the chalcogenide rich layer 314.

A process of forming a selector device according to various embodiments is illustrated in FIG. 5A to FIG. 5D below.

FIG. 5A shows a structure 510 after a pattern and bottom electrode deposition process. As shown in FIG. 5A, a bottom electrode 502 is deposited and patterned on a substrate 501.

FIG. 5B shows a structure 520 after a pattern and switching layer deposition process. As shown in FIG. 5B, a switching layer 505, such as GeS and Cu, or superlattice, is deposited and patterned on the bottom electrode 502. The switching layer 505 may include various materials as described in various embodiments above.

FIG. 5C shows a structure 530 after a pattern and dielectric layer deposition process. As shown in FIG. 5C, a dielectric layer 507 is deposited on the switching layer 505, and is patterned to form a trench 508 exposing at least a portion of the surface of the switching layer 505. The dielectric layer 507 may be a silicon oxide ($SiO_2$) layer, or may include any other suitable dielectric material.

FIG. 5D shows a structure 540 after a pattern and top electrode deposition process. As shown in FIG. 5D, a top electrode 509 is deposited into the trench 508 and on the dielectric layer 507. Accordingly, the selector device 540 according to various embodiments is formed.

The electrodes 503, 509, and the switching layer 505 may be formed using the materials described in various embodiments above with regard to FIG. 3 and FIG. 4. It is understood that the processes of FIG. 5A, 5B and 5D may also be used to form the selector device 300 of FIG. 3 above, with the exclusion of the deposition of the dielectric layer.

FIG. 6 shows a selector device 600 according to various embodiments. The selector device 600 is similar to the selector device 540, and includes the substrate 501, the bottom electrode 503, the switching layer 505, and the top electrode 509. Different from the selector device 540, the selector device 600 includes the switching layer in a different shape, with the dielectric layer 707 formed between the substrate 701 and the switching layer 705. The structure of the selector device is not limited to the structure illustrated in 540 and 600, and may be varied in various embodiments.

The switching layer 505 in FIG. 5D and FIG. 6 may have similar material and similar structure as the switching layer 310 of FIG. 4. Various structures of the switching layer are described in more details in FIG. 7A below, which may be used or included in the switching layer 310 of FIG. 4 and the switching layer 505 of FIG. 5D and FIG. 6.

FIG. 7A shows an example of switching layer 700 of a selector device according to various embodiments.

As shown in FIG. 7A, the switching layer 700 may include one or more metal rich layers arranged in a metal rich layer stack 312 and one or more chalcogenide rich layers arranged in a chalcogenide rich layer stack 314. In an exemplary embodiment, each metal rich layer stack 312 may include one metal rich layer and each chalcogenide rich layer stack 314 may include one chalcogenide rich layer. In another exemplary embodiment, each metal rich layer stack 312 may include two metal rich layers and each chalcogenide rich layer stack 314 may include two chalcogenide rich layers. The switching layer 700 includes two metal rich layer stacks 312 and two chalcogenide rich layer stacks 314, with the metal rich layer stack 312 and the chalcogenide rich layer stack 314 arranged alternately. For illustration purposes, the metal rich layer may be denoted as layer A, and the chalcogenide rich layer may be denoted as layer B. In an exemplary embodiment that each metal rich layer stack 312 includes one metal rich layer A and each chalcogenide rich layer stack 314 includes one chalcogenide rich layer B, the switching layer 900 has a ABAB structure. In an exemplary embodiment that each metal rich layer stack 312 includes two metal rich layers A and each chalcogenide rich layer stack 314 includes two chalcogenide rich layers B, the switching layer 700 shows a (AABB)×2 structure in the form of AABBAABB layers. Each of layer A and layer B may have a thickness in the range of 1-20 nm.

Figure 7B:
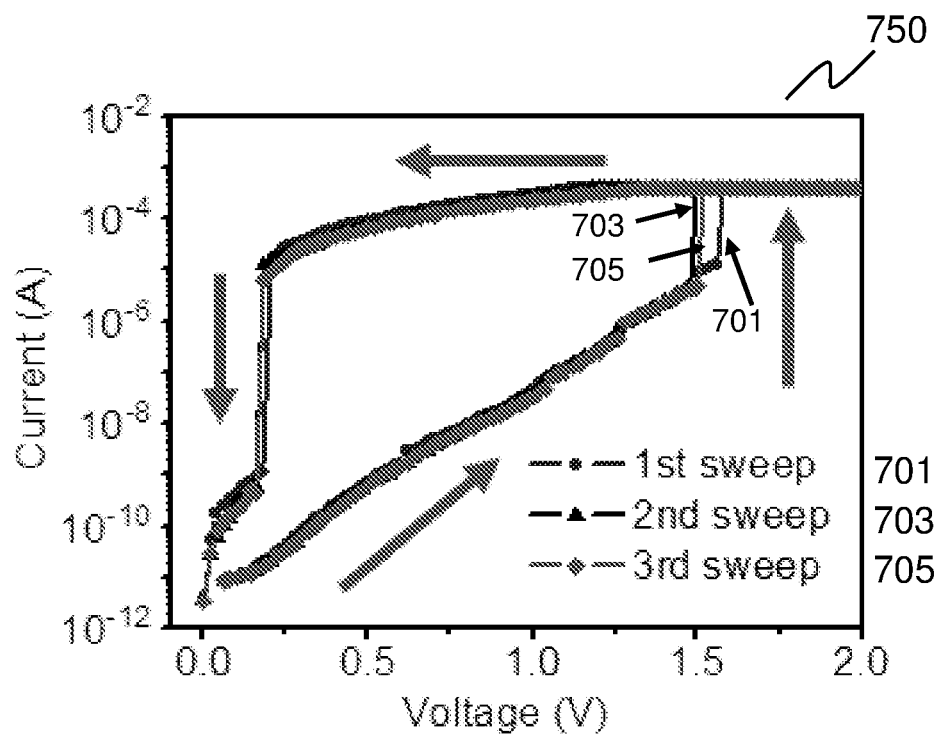
FIG. 7B shows the current-voltage curves of a selector device including the switching layer of FIG. 7A.

FIG. 7B shows the current-voltage curves 750 of a selector device including the switching layer 700 of FIG. 7A, indicating the corresponding performance of the $1^{st}$ voltage sweep 701, the $2^{nd}$ voltage sweep 703 and the $3^{rd}$ voltage sweep 705 according to various embodiments.

Devices with different stack combinations have different switching properties (e.g., $V_{hold}$ and $V_{th}$ can be tuned), which makes it possible to use these switching layer structures for different applications or different RRAM parameters. The optimal thickness and concentration of the switching layer may be designed and configured based on the requirement of real applications.

Figure 8:
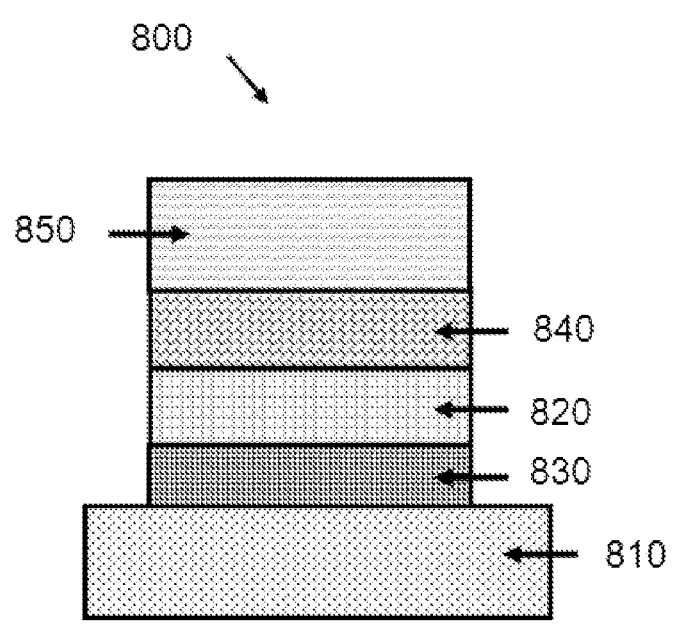
FIG. 8 shows a memory device according to various embodiments.

FIG. 8 shows a memory device 800 according to various embodiments. The memory device 800 may be a non-volatile memory device, e.g., a resistive random access memory device.

The memory device 800 may include a memory cell 840, and a selector device for selecting the memory cell 840. The memory cell 840 may be a resistive random access memory cell.

The selector device may be the selector device 300 of FIG. 3, or the selector device 540 of FIG. 5D, or the selector device 600 of FIG. 6 described in various embodiments above. The selector device may include a first electrode 810, a second electrode 820 and a switching layer 830 sandwiched between the two electrodes as described in various embodiments above. The switching layer 830 may include at least one metal rich layer and at least one chalcogenide rich layer. The metal rich layer may include at least one of a metal or a metal compound, wherein metal content of the metal rich layer is greater than 50 at. %. The chalcogenide content of the chalcogenide rich layer is greater than 50 at. %.

The memory device 800 may include a third electrode 850. The memory cell 840 is arranged on the second electrode 820, and the third electrode 850 is arranged on the memory cell 840. In other words, the memory cell is arranged in between the second electrode 820 and the third electrode 850.

The memory device 800 includes the non-volatile memory cell 840, and the selector device with intermediate electrode 820 connecting with the memory cell 840, each based on a two-terminal design. The first electrode 810 may be a word line, and the third electrode 850 may be a Bit-line in a memory cell array. In various embodiments, a separate electrode may also be used as a word line in connection with the first electrode 810. The memory device 800 can be integrated into a 3D crossbar (cross-point) or 3D vertical RRAM array in various embodiments.

Figure 9:
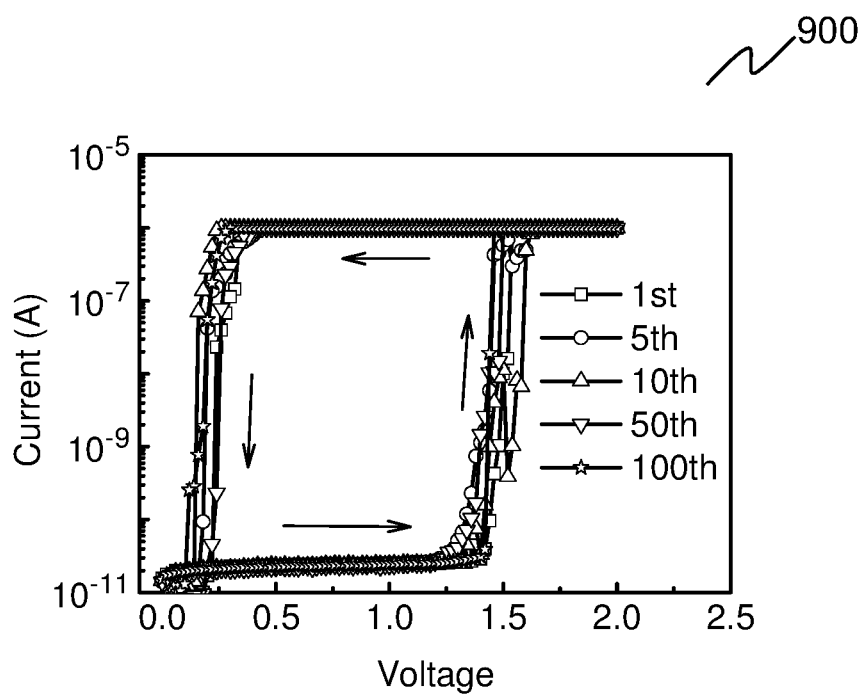
FIG. 9 shows a threshold switching characteristics diagram of a selector device of various embodiments.

FIG. 9 shows a threshold switching characteristics diagram 900 of a selector device of various embodiments, e.g., the selector device 300 of FIG. 3 above. FIG. 9 shows a DC sweep of the selector device with 1 µA compliance current around 100 cycles.

The selector device shows sharp transition at the threshold voltage ($V_{th}$), in this example, around 1.5V, and can hold the high current when the supplied voltage is above the holding voltage ($V_{hold}$), in this example, around 0.2V. The on-states of the selector device can be hold until the voltage drops below $V_{hold}$ (around 0.2V as shown in FIG. 9) during the backward sweeping. As shown in FIG. 9, a low leakage current of about 10 pA, a low holding voltage of about 0.2V, a gap of about 1.3V between the on voltage and holding voltage, and a sharp transition have been achieved.

Figure 10:
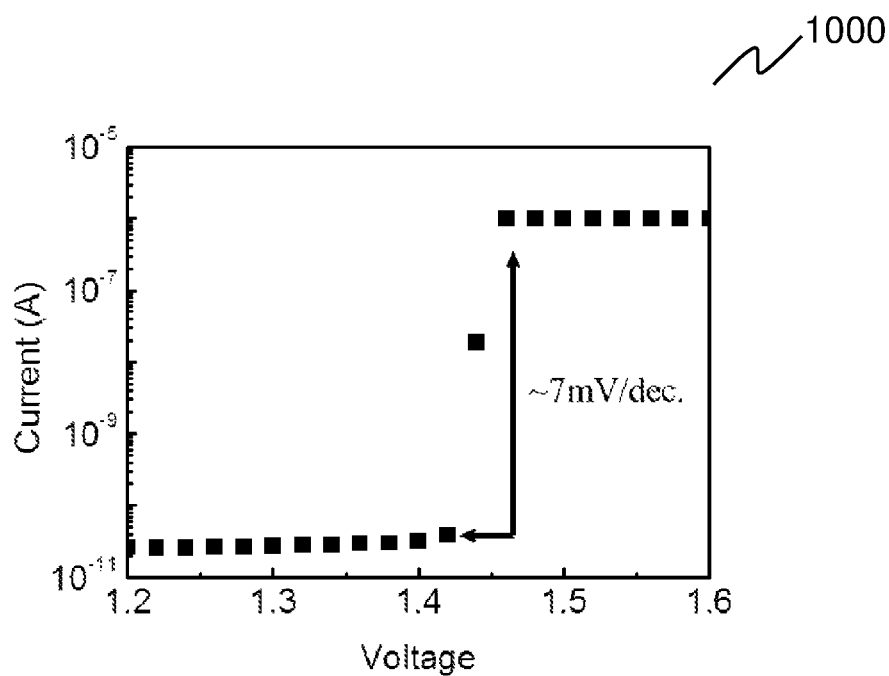
FIG. 10 is a zoomed-in plot showing the turn-on slope of the selector device at a threshold voltage according to various embodiments.

FIG. 10 is a zoomed-in plot 1000 showing the turn-on slope of the selector device at $V_{th}$ (e.g., around 1.5V) according to various embodiments. The selector device shows extremely sharp turn-on slope of around 7 mV/dec, which is beneficial to array level operations (e.g., larger read voltage margin, faster read).

Figure 11:
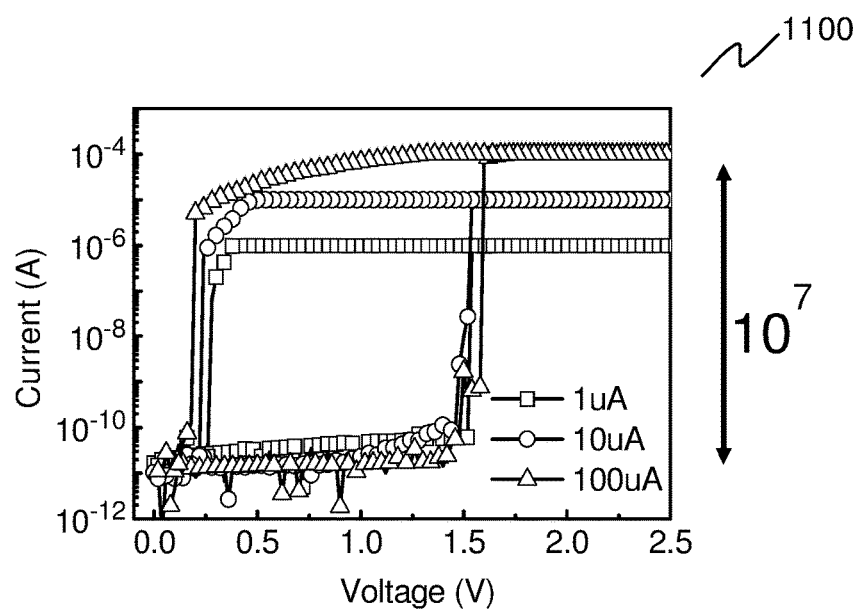
FIG. 11 shows a diagram illustrating the DC sweep of selector device with different compliance current from 1 µA to 100 µA according to various embodiments.
Figure 12:
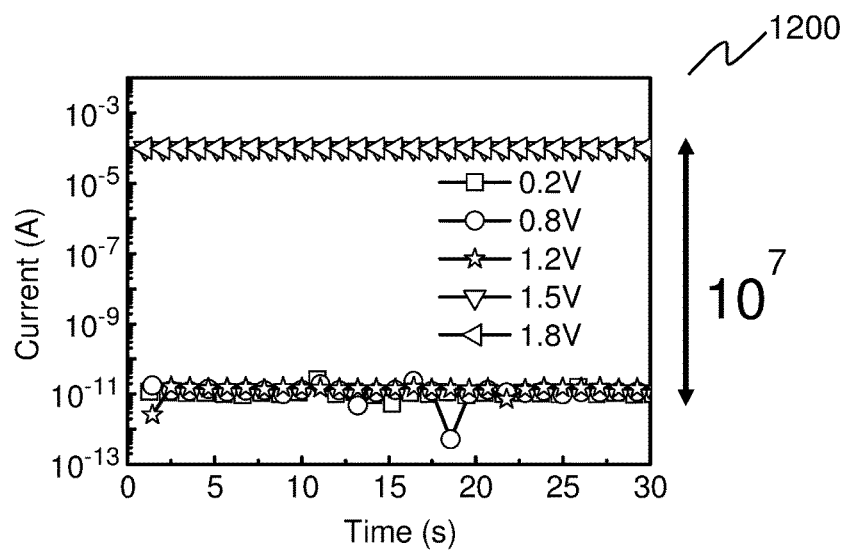
FIG. 12 shows a diagram illustrating the DC cyclings of the selector at different DC bias voltages according to various embodiments.

FIG. 11 shows a diagram 1100 illustrating the DC sweep of selector device with different compliance current from 1 µA to 100 µA according to various embodiments. As shown in FIG. 11, The $V_{th}$ is independent to the compliance current while the holding voltage becomes lower with higher compliance current. As shown in FIG. 11, a low leakage current of about 10 pA, a low holding voltage of about 0.2V, a gap of about 1.3V between the on voltage and holding voltage, a high on/off window of about $10^7$, and a sharp transition have been achieved FIG. 12 shows a diagram 1200 illustrating the DC cyclings of the selector at different DC bias voltages according to various embodiments. The on/off current of the selector at different reading voltage from 0.2V to 1.8V is shown. The selector is OFF when the voltage is below $V_{th}$ of about 1.5V, and becomes ON when the voltage is above $V_{th}$. A current compliance of 100 µA is applied to prevent hard breakdown of selector. The off current is 10 pA and on current is 100 µA (which is the compliance current).

Figure 13:
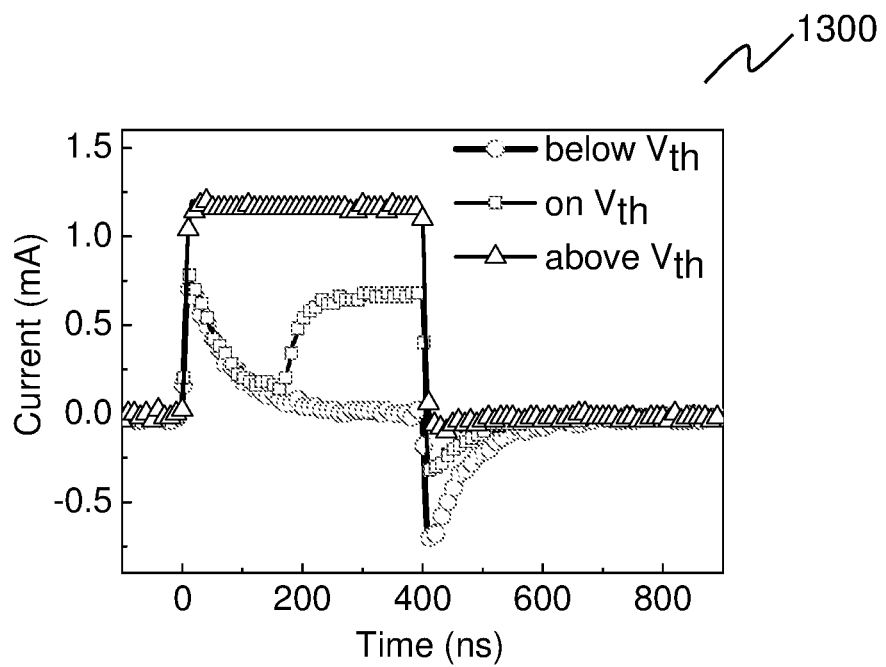
FIG. 13 shows a diagram illustrating the transient effect and current response when varying the amplitudes of the applied voltage pulse according to various embodiments.

FIG. 13 shows a diagram 1300 illustrating the transient effect and current response when varying the amplitudes of the applied voltage pulse according to various embodiments. When the amplitude of the applied voltage pulse is lower than $V_{th}$, the selector device does not turn on and a negative overshoot can be observed obviously when the pulse turns off. When the applied voltage is at the $V_{th}$, the selector needs some time to turn on and the negative overshoot becomes weak. When the applied voltage is higher than $V_{th}$, the selector turns on quickly and there is nearly no negative overshoot.

Figure 14:
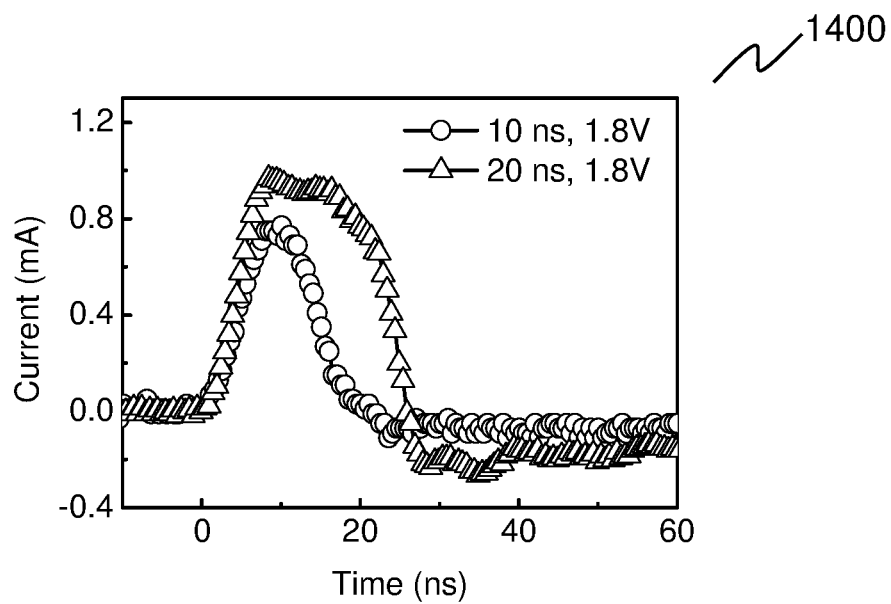
FIG. 14 shows a diagram illustrating the transient curve of on-current profile under different pulses according to various embodiments.

FIG. 14 shows a diagram 1400 illustrating the transient curve of on-current profile under different pulses of 10 ns and 20 ns, respectively, according to various embodiments. It can be seen that the device can be switched on ultrafast within 10 ns at voltage of 1.8V, while the corresponding on-current is about 0.8 mA.

Figure 15:
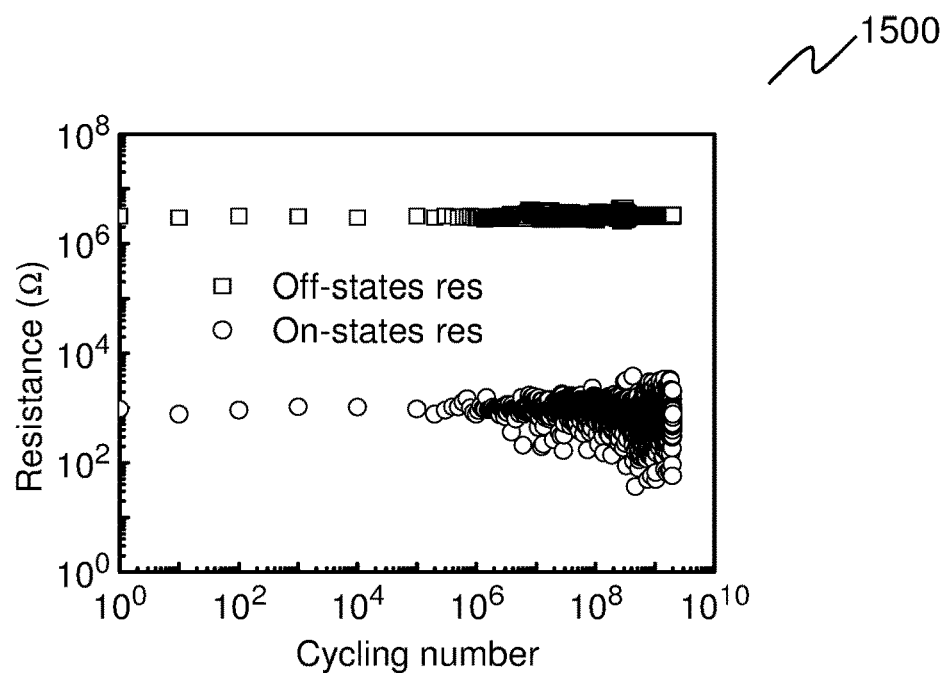
FIG. 15 shows a diagram illustrating the pulse endurance test of the selector device according to various embodiments.

FIG. 15 shows a diagram 1500 illustrating the pulse endurance test of the selector device conducted with pulse width of 10 ns and amplitude of 1.8V according to various embodiments. The selector device shows above $10^9$ endurance cycling with a stable on/off resistance behavior. The off resistance is read around 3 kΩ due to tester limitation and the actual value should be much higher. The On resistance is around 1 kΩ. The corresponding on/off current is 0.9 mA and $10^{-7}$A, respectively.

Figure 16:
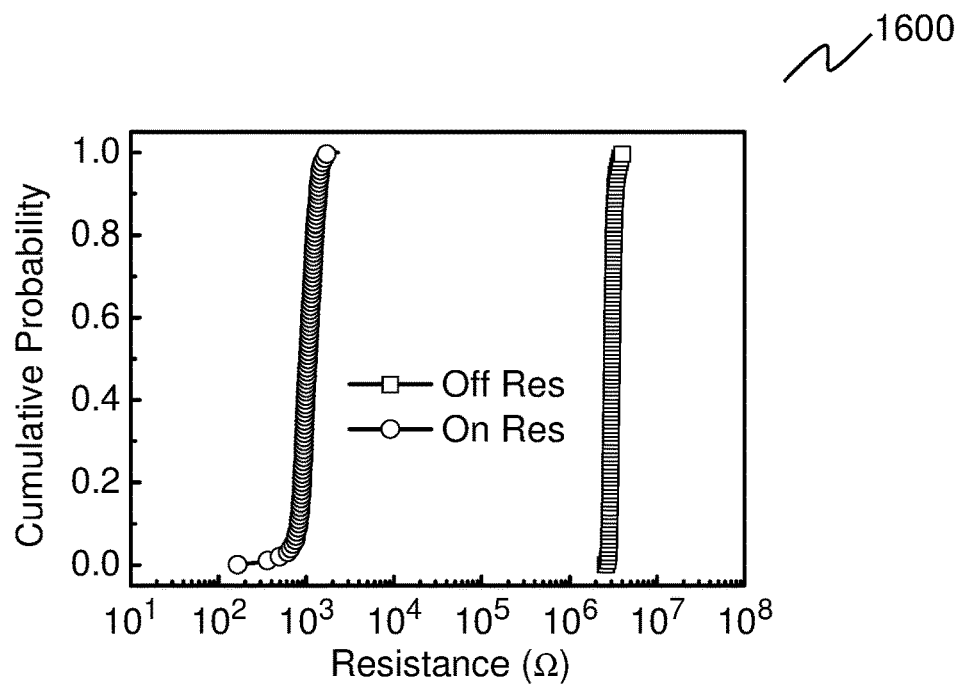
FIG. 16 shows a diagram illustrating the distribution of On/Off resistance during the endurance cycling according to various embodiments.

FIG. 16 shows a diagram 1600 illustrating the distribution of On/Off resistance during the endurance cycling according to various embodiments. The On/Off resistance distribution shows that the selector has good stability and repeatability.

Figure 17:
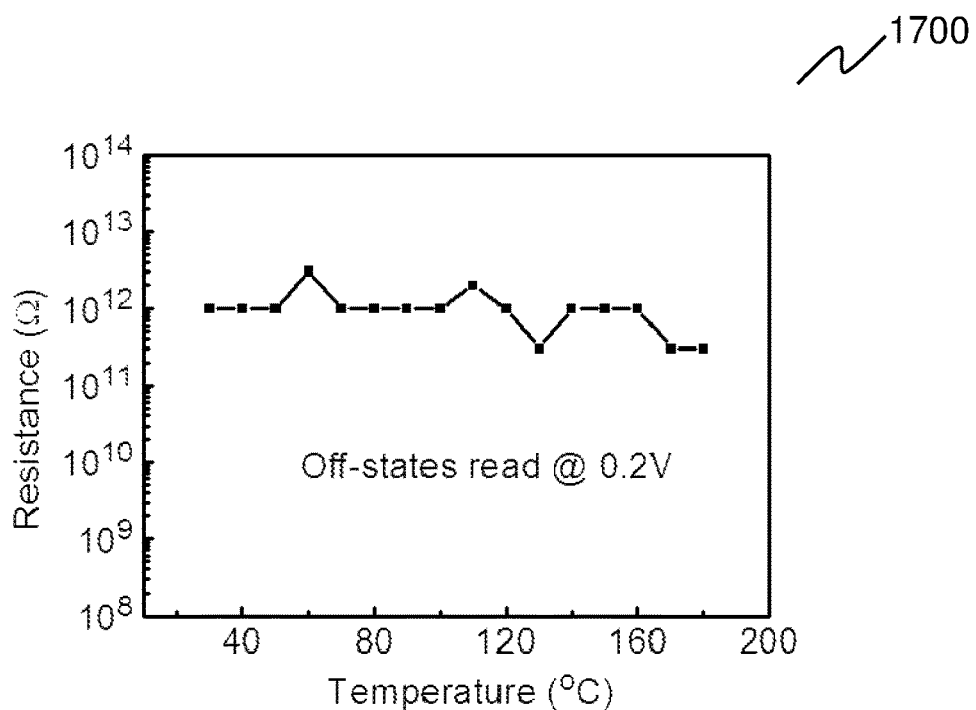
FIG. 17 shows a diagram illustrating an exothermal resistance measurement (ETTM) results for the selector according to various embodiments.

FIG. 17 shows a diagram 1700 illustrating an exothermal resistance measurement (ETTM) results for the selector according to various embodiments. The selector device thermal stability is investigated using an exothermal resistance measurement (ETTM) at a constant heating rate of 20° C./min. The selector device shows good thermal stability when temperature ramps up to 180° C.

Figure 18:
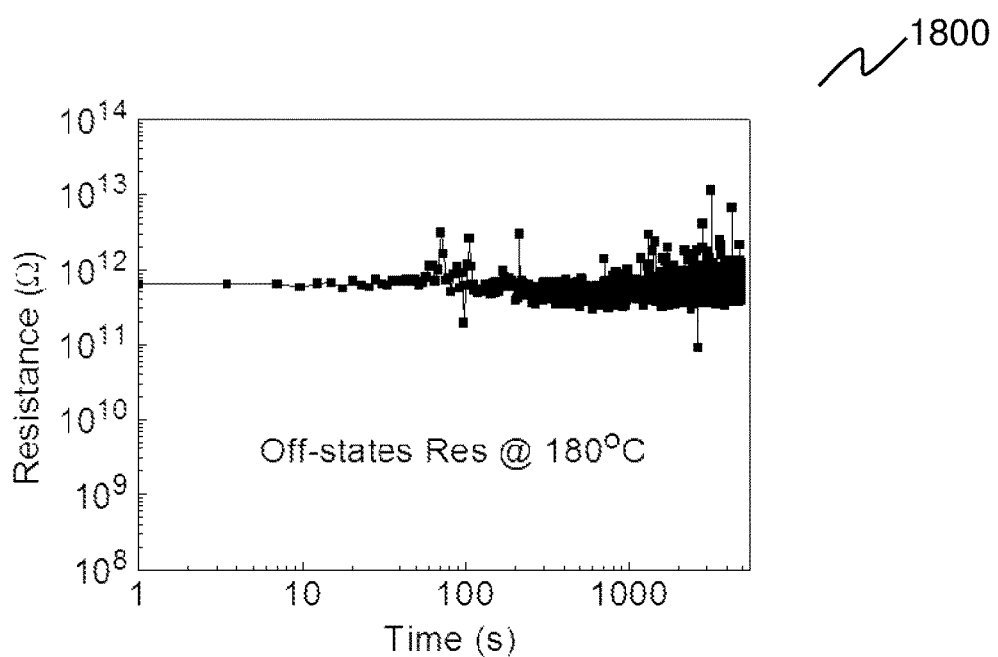
FIG. 18 shows a diagram illustrating the selector resistance retention according to various embodiments.

FIG. 18 shows a diagram 1800 illustrating the selector resistance retention at 180° C. according to various embodiments. There is no degradation found after the selector device is kept at 180° C. for 2 hours.

Figure 19:
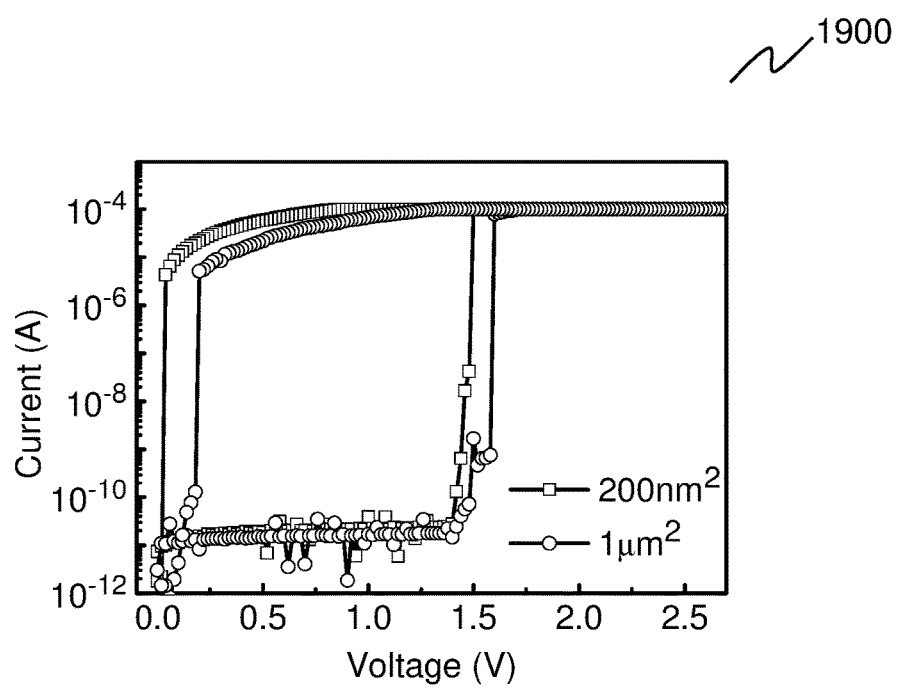
FIG. 19 shows a diagram illustrating the DC sweep results for selectors with different sizes according to various embodiments.

FIG. 19 shows a diagram 1900 illustrating the DC sweep results for selectors with different sizes of 1 µm and 200 nm, respectively, according to various embodiments. There is no obvious difference between 1 µm and 200 nm selector devices during the DC sweep. The on current can still maintain the same as the selector device scales down to 200 nm. Accordingly, the selector shows good potential in further scaling. When device size scales down, the current-voltage curve shows nearly the same performance.

Figure 20A:
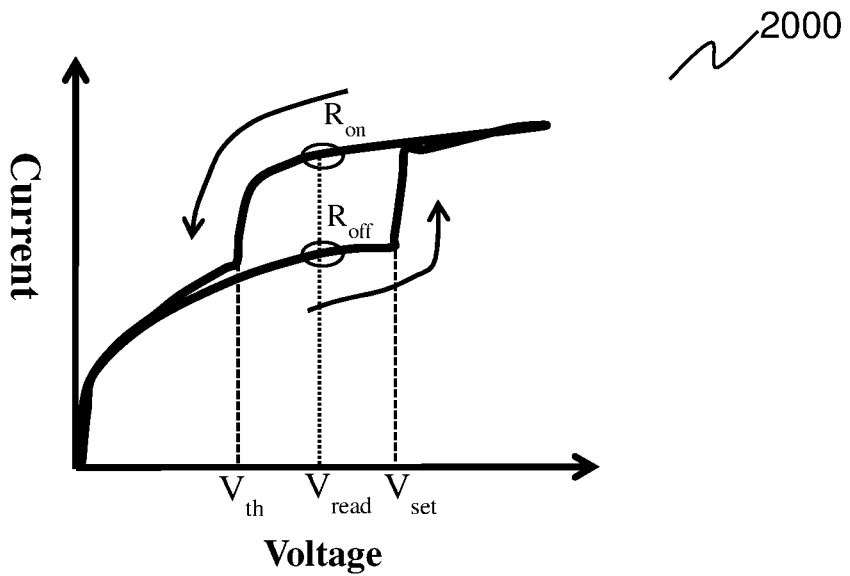
FIG. 20A shows a current-voltage curve for a RRAM device integrated with conventional selectors.

FIG. 20A shows a current-voltage curve 2000 for a RRAM device integrated with conventional selectors.

As shown in FIG. 20A, when the voltage is below the threshold voltage of the selector ($V_{th}$), the current-voltage curves nearly overlap each other between the forward sweeping and backward sweeping. The RRAM operation can be accessed only if a read voltage ($V_{read}$) and a reset/set ($V_{set}$ or $V_{reset}$) voltage are above the threshold voltage. As illustrated in FIG. 20A, the read voltage must locate between the threshold voltage and the set voltage. Because of the variation of threshold voltages from device to device, the difference between the threshold voltages to the read voltage cannot be too small. Similarly, the difference between the read voltage to the set/reset voltage cannot be too small, due to the variation of the set/reset voltages. Therefore, the difference between the threshold voltages to the set/reset voltages is required to be large enough in order to have enough margins for the readout operation. Furthermore, in order to lower the leakage current from half-select memory cells, the half select voltage is desired to be smaller than the threshold voltage of selector. The threshold voltage is required to be large, and the scaling of the threshold voltage is limited. All these conditions lead to a large reading voltage and large set/reset voltages. This will result in high power consumption. A strict constraint is also set on the matching between RRAM and selector.

Figure 20B:
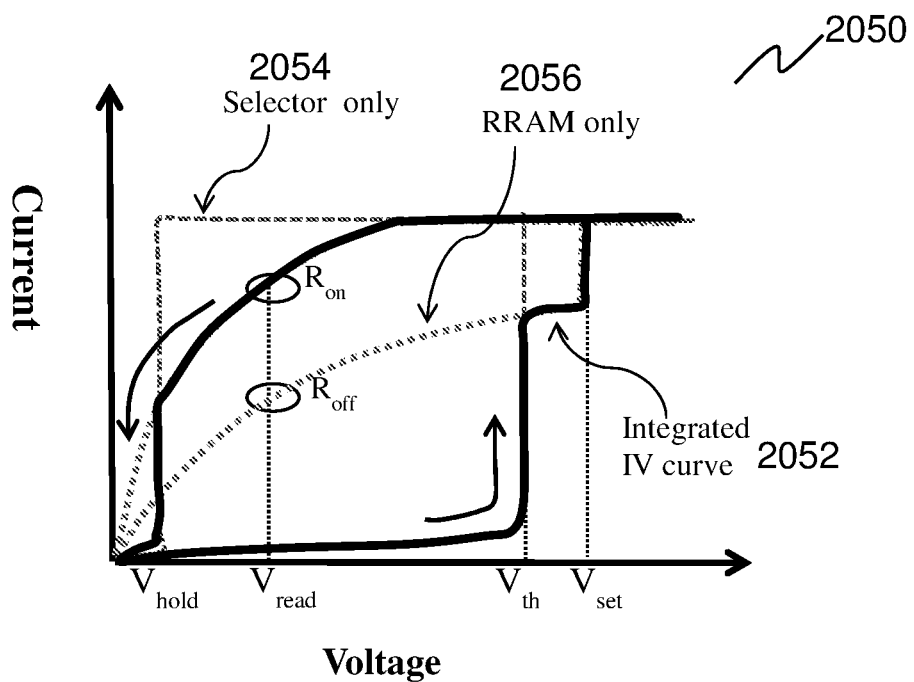
FIG. 20B shows a current-voltage curve for a RRAM device integrated with a selector device of various embodiments.

FIG. 20B shows a current-voltage curve 2050 for a RRAM device integrated with a selector device of various embodiments above. The solid line 2052 is the integrated IV (current-voltage) curve of the 1S1R device including one selector and one memory, and the dotted lines 2054, 2056 is the IV curves of the individual selector of the embodiments and the individual RRAM, respectively. Because of the holding voltage behavior of the selector, the forward and backward voltage sweepings do not overlap each other. During the forward sweeping, it follows the selector current-voltage curve until reaching the threshold voltage. During the backward sweeping, it follows the RRAM current-voltage curve until the voltage drops below the holding voltages. The integration of the selector device of various embodiments with the RRAM exhibits a larger hysteresis window when the voltage is below the selector threshold voltage. The large hysteresis loop will enable a lower reading voltage.

The operation of memory cell through the selector device is described in more detail below.

Figure 21:
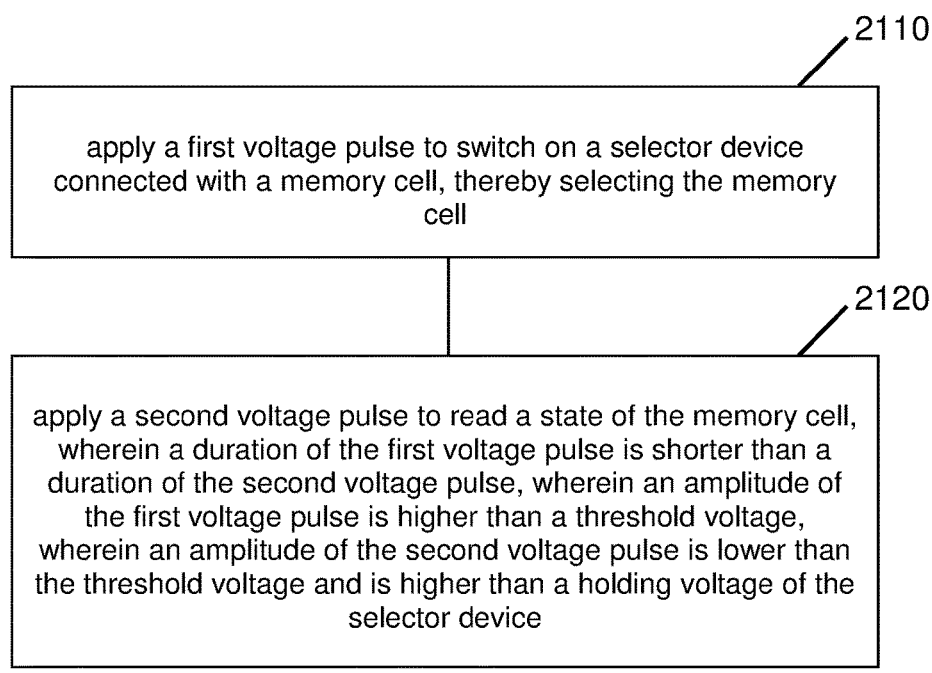
FIG. 21 shows a flowchart illustrating a method of operating a memory cell through a selector device connected with the memory cell according to various embodiments.

FIG. 21 shows a flowchart 2100 illustrating a method of operating a memory cell through a selector device connected with the memory cell according to various embodiments.

At 2110, a first voltage pulse is applied to switch on the selector device, thereby selecting the memory cell.

At 2120, a second voltage pulse is applied to read a state of the memory cell. A duration of the first voltage pulse is shorter than a duration of the second voltage pulse. An amplitude of the first voltage pulse is higher than a threshold voltage. An amplitude of the second voltage pulse is lower than the threshold voltage and is higher than a holding voltage of the selector device.

A threshold voltage is referred to be a voltage at or above which the selector device is switched on, e.g., from a high-resistance OFF state to a low-resistance ON state.

A holding voltage is referred to as a voltage at or above which the on-states of the selector device can be hold.

The selector device described in the context of the method for operating the memory below may be the selector device 300, 540, 600 described in various embodiments above. Various embodiments described with regard the selector device are analogously valid for the method of operating the memory cell through the selector device, and vice versa.

In other embodiments, the method of various embodiments described herein may also be used for a memory device with other types of selector device different from the above embodiments.

In various embodiments, the duration of the first voltage pulse is in a range of 5 ns to 20 ns. The duration of the second voltage pulse is longer than 50 ns, for example, in the range of 50-100 ns, 100-1000 ns, etc. In various embodiments, the duration of the second voltage pulse may be at least two times longer than the duration of the first voltage pulse.

In various embodiments, the threshold voltage is lower than a set voltage or a reset voltage of the memory cell, wherein the set voltage is a voltage at which the memory cell transits from a high-resistance state to a low-resistance state, and the reset voltage is a voltage at which the memory cell transits from the low-resistance state to the high-resistance state.

In various embodiments, the threshold voltage is higher than the set voltage or the reset voltage of the memory cell. In the embodiments wherein a time period for switching the state of the memory cell is longer than the duration of the first voltage pulse, i.e., when the memory cell a switching speed slower than the first voltage pulse, the second voltage pulse is applied to read the state of the memory cell, wherein the amplitude of the second voltage pulse is lower than the set voltage or the reset voltage.

In various embodiments, the threshold voltage is higher than the set voltage or the reset voltage of the memory cell. In the embodiments wherein a time period for switching the state of the memory cell is shorter than the duration of the first voltage pulse, i.e., the memory cell has a switching speed faster than the first voltage pulse, a resistor is connected in series with the selector device and the second voltage pulse is applied to read the state of the memory cell. The amplitude of the second voltage is lower than the set voltage or the reset voltage. In various embodiments, the method may further include disconnecting the resistor with the selector device, and applying the set voltage or the reset voltage to set or reset the memory cell.

In various embodiments, the threshold voltage is higher than the set voltage or the reset voltage of the memory cell. A third voltage pulse may be applied following the first voltage pulse to write the memory cell. A duration of the third voltage is longer than the duration of the first voltage pulse. An amplitude of the third voltage pulse is lower than the threshold voltage, and is higher than the set voltage or the reset voltage.

In various embodiments, the duration of the first voltage pulse may be adaptively modified.

Various embodiments of the above method are described in more detail below.

Figure 22A:
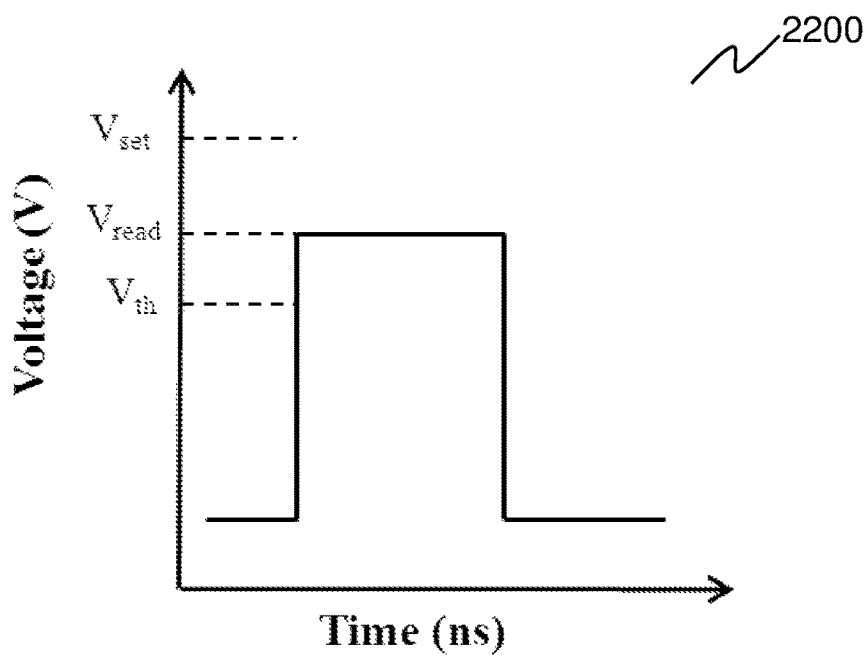
FIG. 22A shows a diagram illustrating a conventional pulse reading scheme.

FIG. 22A shows a diagram 2200 illustrating a conventional pulse reading scheme.

In the conventional method as shown in FIG. 22A, the read voltage $V_{read}$ has a value between the threshold voltage $V_{th}$ and the set voltage $V_{set}$. The read voltage is higher than the threshold voltage, which consumes high power.

Figure 22B:
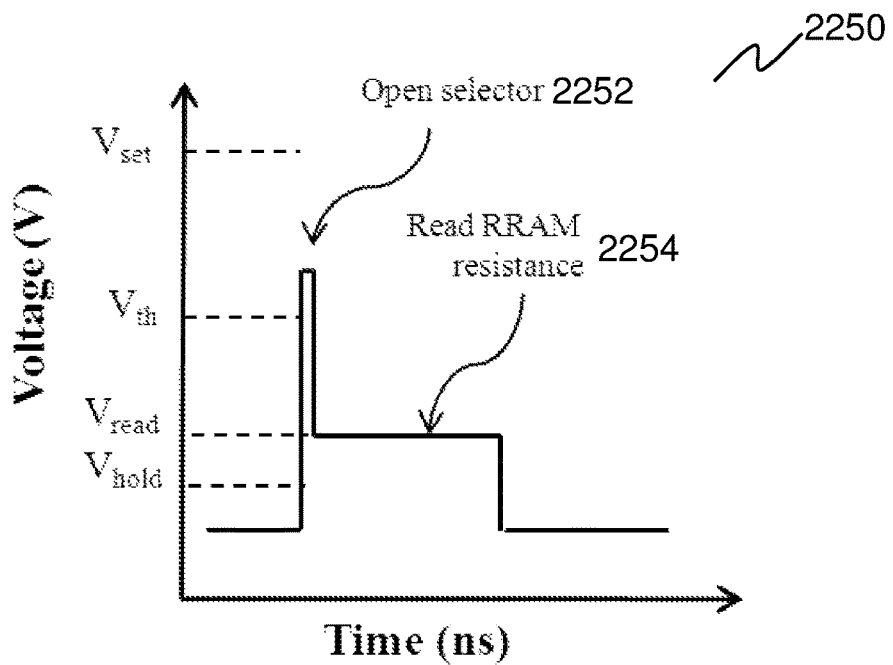
FIG. 22B shows a diagram illustrating an operating scheme according to a memory cell operating method of various embodiments.

FIG. 22B shows a diagram 2250 illustrating an operating scheme according to a memory cell operating method of various embodiments.

As shown in FIG. 22B, a first voltage pulse 2252 is applied to open or switch on a selector device connected with a memory cell, thereby selecting the memory cell. A second voltage pulse 2254 is applied to read a state of the memory cell, for example, to read the resistance of a RRAM memory cell so as to determine the state of the memory cell. Compared to the second voltage pulse 2254, the first voltage pulse 2252 has a shorter duration and has higher amplitude. The amplitude of the first voltage pulse 2252 is higher than the threshold voltage of the selector device, and the amplitude of the second voltage pulse 2254 is lower than the threshold voltage.

In various embodiments, the operating scheme of FIG. 22B may be used when a selector device with a low holding voltage and a large holding voltage window, for example, the selector device 300, 540, 600 described in various embodiments above, is used to select the memory cell. Since there is a special region ranging from the holding voltage to the threshold voltage as shown in FIG. 20B above, this region is utilized to read out the memory status in this method. As shown in FIG. 22B, the reading scheme includes two pulses: a short pulse (e.g., about 10 ns) with a high amplitude (greater than $V_{th}$), and a long pulse (e.g., about 1 µs) with a low amplitude (great than $V_{hold}$ but less than $V_{th}$). The first high amplitude pulse is designed to turn on the selector without changing the state of the RRAM, and the following low amplitude pulse reads the resistance of RRAM. With this scheme, the status of RRAM can be read out at a low voltage, thereby saving energy efficiently. According to the method of the above embodiments, the reading voltage and the set/reset voltage can be reduced to achieve power saving, and there is also no match requirement between RRAM and the selector device requiring that the set/reset voltage of RRAM is higher than the threshold voltage of the selector device.

Figure 23A:
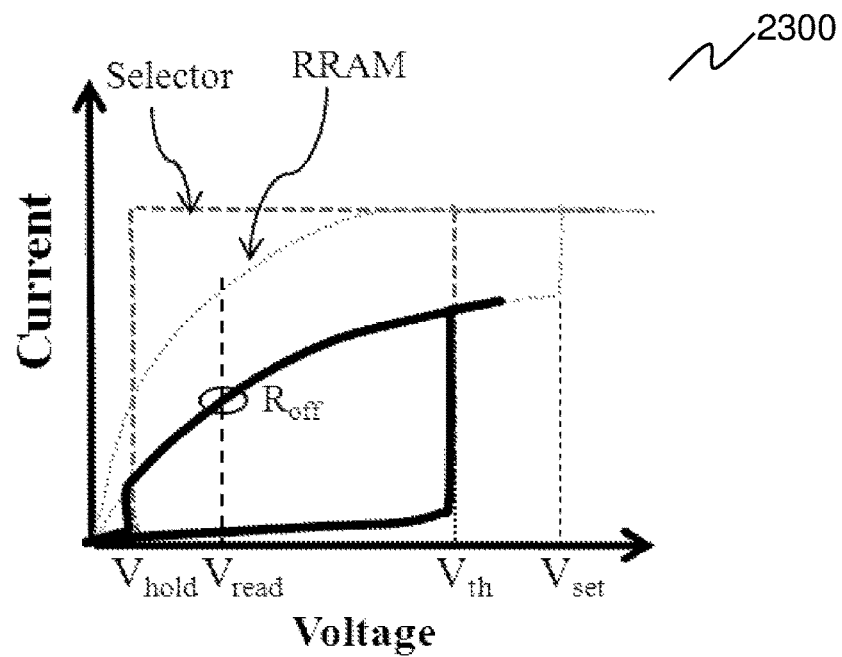
FIG. 23A shows a current-voltage curve for reading operation when a RRAM cell integrated with a selector device is at off-state according to various embodiments.

FIG. 23A shows a current-voltage curve 2300 for reading operation when a RRAM cell integrated with a selector device is at off-state according to various embodiments.

The reading operation under the DC sweep mode is illustrated in FIG. 23A, on the condition that the set/reset voltage is greater than threshold voltage of the selector device. After the selector is switched on, the current-voltage curve follows the high resistance RRAM curve until the voltage drops to holding voltage.

Figure 23B:
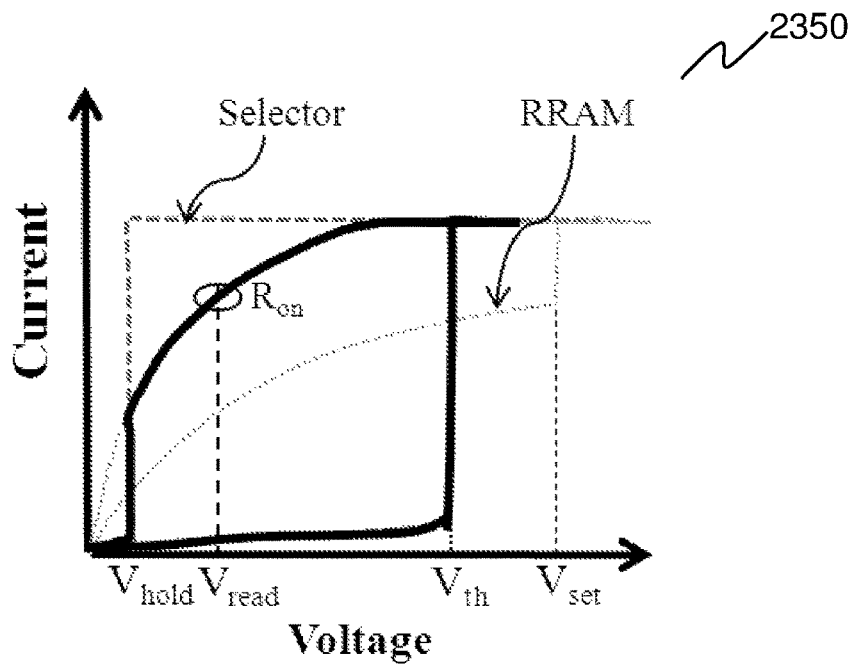
FIG. 23B shows a current-voltage curve for reading operation when the RRAM cell integrated with the selector device is at the low resistance on-state according to various embodiments.

FIG. 23B shows a current-voltage curve 2350 for reading operation when the RRAM cell integrated with the selector device is at the low resistance on-state according to various embodiments. FIG. 23B is also on the condition that the set/reset voltage is greater than threshold voltage of the selector device. Once the selector opens, the IV curve follows the RRAM curves until the voltage drops to holding voltage. The on-off ratio remains the same as the RRAM. The overall readout window follows the RRAM on/off window.

The method of operating the memory cell according to various embodiments may also apply to the situation of a low set voltage or a low reset voltage, as described in various embodiments below.

Figure 24:
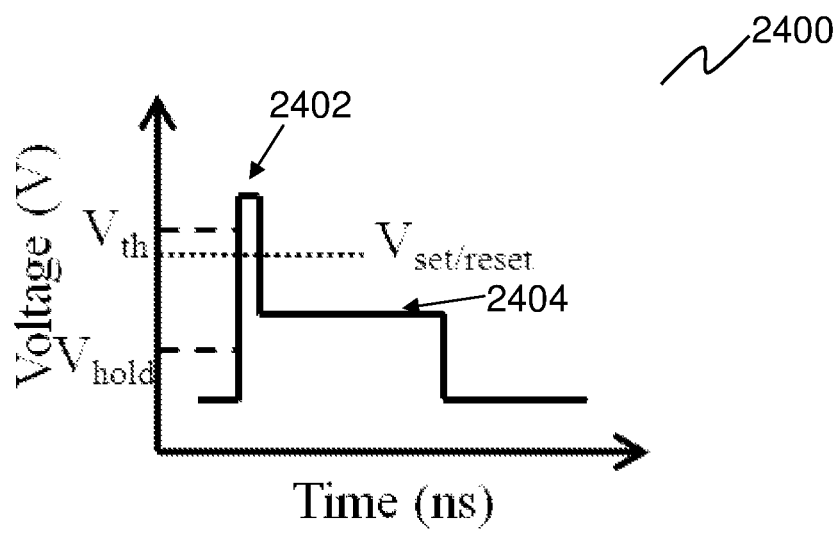
FIG. 24 shows a diagram illustrating an operating scheme according to a memory cell operating method of various embodiments.

FIG. 24 shows a diagram 2400 illustrating an operating scheme according to a memory cell operating method of various embodiments.

In the embodiments of FIG. 24, the set/reset voltage of the memory cell is not greater than the threshold voltage of the selector device, e.g., the set/reset voltage is lower than the threshold voltage of the selector device as shown in FIG. 24.

As shown in FIG. 24, a first voltage pulse 2402 is applied to switch on the selector device, thereby selecting the memory cell. A second voltage pulse 2404 is then applied to read the state of the memory cell. The first voltage pulse 2402 has an amplitude higher than the threshold voltage. The second voltage pulse 2404 has an amplitude lower than the threshold voltage and the set/reset voltage.

In various embodiments, the memory cell has a switching speed slower than the first voltage pulse, for example, a slow switching speed of more than 50 ns. Accordingly, the first pulse 2402 with a short duration, e.g., about 10 ns, cannot change/modify the state of the memory cell. The low amplitude second pulse 2404 is then used to read out the resistance the memory cell without modifying the status of the memory cell.

Figure 25:
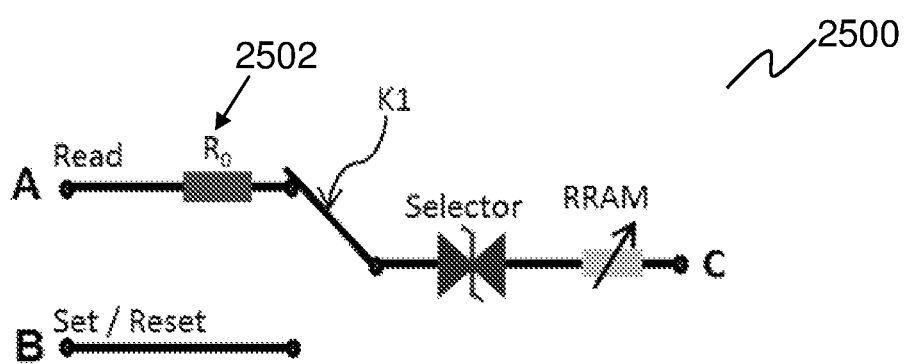
FIG. 25 shows a circuit diagram for a memory device with fast switching speed and low set/reset voltage according to various embodiments.

In various embodiments, the memory cell may have a fast switching speed faster than the first voltage pulse, e.g., a fast switching speed of 10 ns or less when the duration of the first voltage pulse is about 10 ns. FIG. 25 shows a circuit diagram 2500 for a memory device with fast switching speed and low set/reset voltage according to various embodiments. In this embodiment, an extra resistor ($R_0$) 2502 may be connected to the selector device, as shown in FIG. 25. The value of the resistor is required to be between the on resistance ($R_{on}$) and the off resistance ($R_{off}$) of the memory cell, in this example, the RRAM cell. That is, $R_{off} > R_0 > R_{on}$. For example, $R_{on}$ may be about 1 kΩ, $R_0$ may be about 10 kΩ, and $R_{off}$ may be about 100 kΩ.

Figure 26:
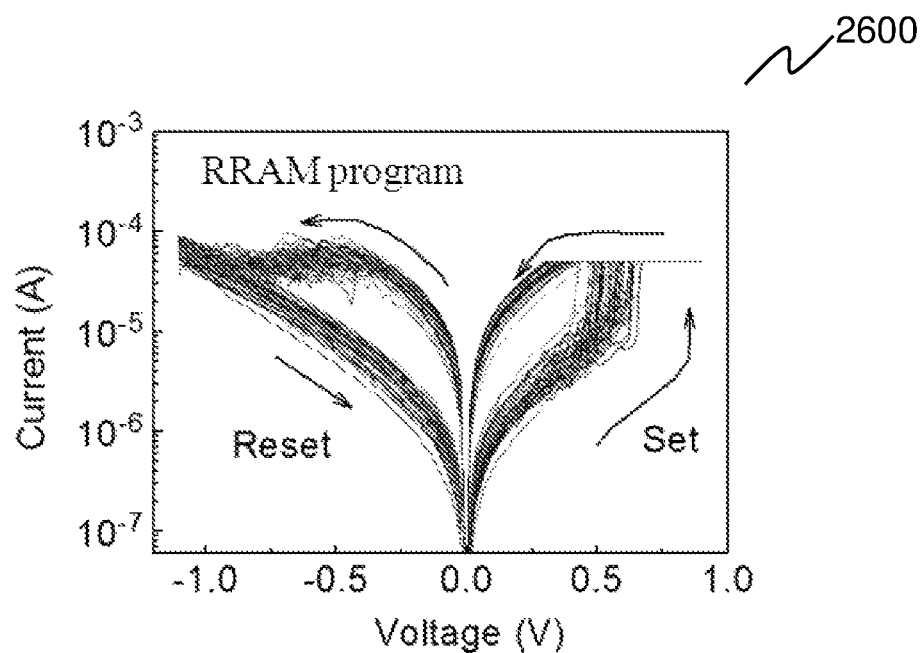
FIG. 26 shows a current-voltage curve of the RRAM according to various embodiments.

During read operation, the K1 switch will connect to terminal A. During the set or reset operation, the K1 switch will connect to terminal B, in which the resistor $R_0$ is disconnected with the selector. The read operation may be conducted at the same voltage direction as the reset operation. If the RRAM stays at the high resistance states, the majority of voltage drop falls on the RRAM once the selector turns on. Because the voltage direction is the same as the reset operation, the RRAM will remain at the high resistance states and its value will be readout. On the other hand, if the RRAM stays at the low resistance states, the majority of the voltage drop falls on the resistor ($R_0$) once the selector turns on. Thus, the voltage drop on the RRAM is too small to modify the RRAM status. RRAM will remain at the same status. In this situation, the readout resistance will be the $R_0$, as $R_0$ is greater than $R_{on}$ and the memory readout window is slightly sacrificed. The current-voltage curve 2600 showing the set, reset and program operations of the RRAM is shown in FIG. 26.

Table 1 illustrates the operation method in the various scenarios of FIGS. 22B, 24 and 25 above.

In the scenario of FIG. 22B, in which the memory cell is matched with the selector in that the set/reset voltage is higher than the threshold voltage of the selector, the reading operation may be performed directly according to the voltage pulses of FIG. 22B.

In the scenario wherein the memory cell is mismatched with the selector in that the set/reset voltage is not greater than the threshold voltage of the selector, there are two different situations.

TABLE 1

Analysis for circuit configuration during reading operation for different RRAM parameters

| RRAM condition | | Action | |
| --- | --- | --- | --- |
| High $V_{set/reset}$ ($V_{set/reset} > V_{th}$) | | Read directly according to FIG. 22B | |
| Low $V_{set/reset}$ ($V_{set/reset} \leq V_{th}$) | RRAM with slow switching speed | Read directly according to FIG. 24 | |
| | RRAM with fast switching speed | Read at reset operation side with a series resistance ($R_0$) inside the sensing loop as in FIG. 25 ($R_{off} > R_0 > R_{on}$) | RRAM at off-states (high resistance) Readout resistance: $R_{off} + R_0 \approx R_{off}$ |
| | | | RRAM at on-states (low resistance) Readout resistance: $R_0 + R_{on} \approx R_0$ |

The first situation is that the memory cell (e.g., RRAM) has a slow switching speed. If RRAM switching speed is slow enough (e.g., >50 ns), the first short pulse of about 10 ns as shown in FIG. 24 cannot modify the state of the RRAM. The subsequent low amplitude pulse is then applied to read out the RRAM resistance without modifying the RRAM status.

The second situation is that the RRAM has a fast switching speed. In this condition, an extra resistor ($R_0$) is connected to the selector as shown in FIG. 25, with the value of the resistor located between the on resistance and the off resistance of the RRAM. The read operation conducts at the same voltage direction as the reset operation. If the RRAM stays at the high resistance state, the majority of voltage drop falls on the RRAM once the selector turns on. Because the voltage direction is the same as the reset operation, the RRAM will remain at the high resistance states and its value will be read out. On the other hand, if the RRAM stays at the low resistance states, the majority of the voltage drop falls on the resistor ($R_0$) once the selector turns on. Thus, the voltage drop on the RRAM is too small to modify the RRAM status. RRAM will remain at the same status. In this situation, the readout resistance will be the $R_0$ as $R_0$ is greater than $R_{on}$ and the memory readout window is slightly sacrificed.

According to the various embodiments as illustrated in Table 1, the benefit of this scheme is that the set/reset voltage is not required to be greater than the threshold voltage of the selector, which is a must in the conventional integration scheme. According to various embodiments, the set/reset voltage, usually about 1V, can be smaller than the threshold voltage.

As a result, the operation method according to various embodiments above can greatly reduce the energy consumption during the reading operation, as well as the set/reset operation. Moreover, it can release the parameter matching requirements between the RRAM and selectors, which significantly ease the manufacture implementation.

According to the methods of various embodiments above, lower reading voltage, lower program voltages, and lower half select leakage current during program operation can be achieved, thereby achieving significant energy saving. Further, the matching requirement between RRAM and selector is loosen, thereby enabling easier manufacture implementation.

Figure 27:
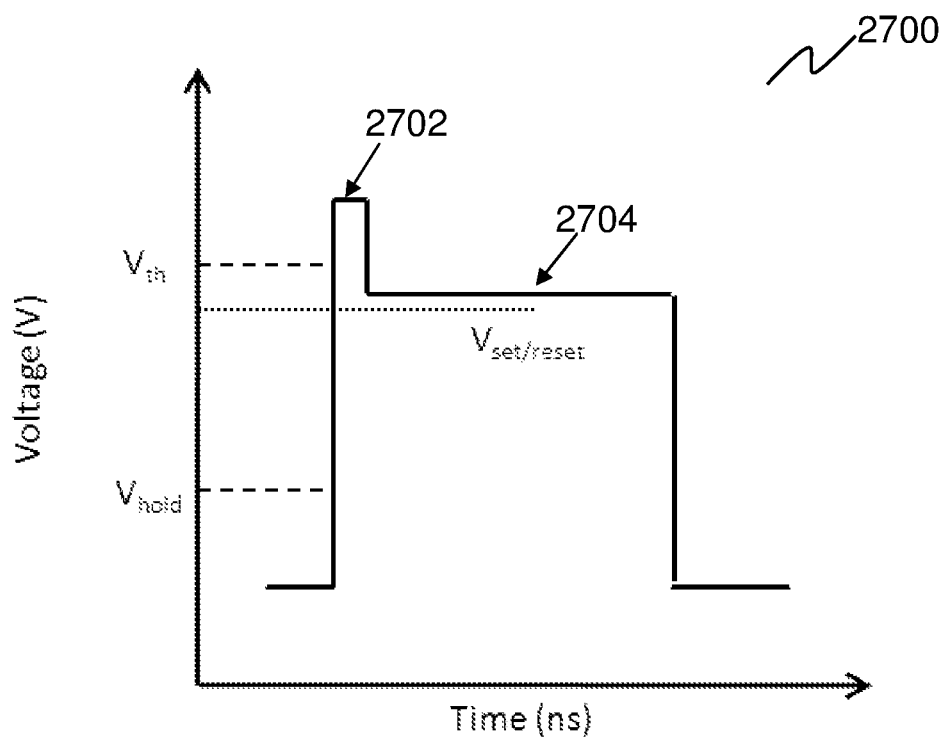
FIG. 27 shows a diagram illustrating an operating scheme according to a memory cell operating method of various embodiments.

FIG. 27 shows a diagram 2700 illustrating an operating scheme according to a memory cell operating method of various embodiments.

In the embodiments of FIG. 27, the set/reset voltage $V_{set/rest}$ of the memory cell is lower than the threshold voltage $V_{th}$ of the selector.

As shown in FIG. 27, a first voltage pulse 2702 with an amplitude higher than the threshold voltage is applied to switch on the selector, thereby selecting the memory cell connected with the selector. A second voltage pulse 2704 is subsequently applied to write the memory cell, wherein the second voltage pulse 2704 has an amplitude higher than the set/reset voltage and lower than the threshold voltage. The duration of the first pulse 2702 is substantially shorter, for example, at least two times shorter, than the duration of the second pulse 2704. In the embodiment of FIG. 27, the operation speed of the memory cell may be slow, for example, the time need for the switching of memory cell is longer than the duration of the first pulse 2702. The method according to FIG. 27 minimizes the over-set or over-reset, and achieves lower power consumption.

Figure 28:
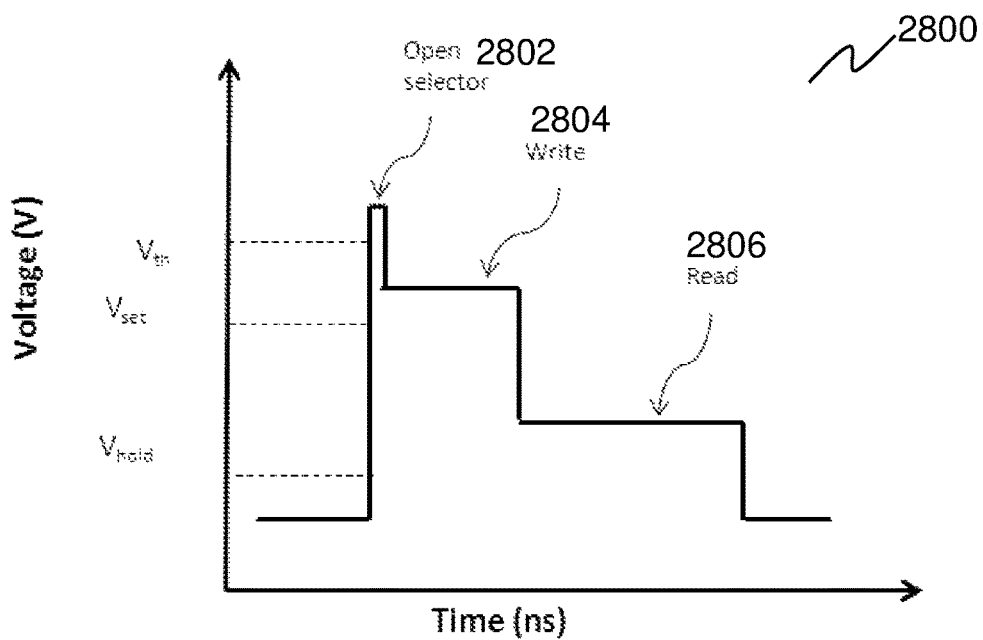
FIG. 28 shows a diagram illustrating an operating scheme according to a memory cell operating method of various embodiments.

FIG. 28 shows a diagram 2800 illustrating an operating scheme according to a memory cell operating method of various embodiments.

As shown in FIG. 28, a first pulse 2802 with an amplitude higher than the threshold voltage is applied to switch on the selector, thereby selecting the memory cell connected with the selector. A second voltage pulse 2804 is subsequently applied to write the memory cell, wherein the second voltage pulse 2804 has an amplitude higher than the set/reset voltage and lower than the threshold voltage. The duration of the first pulse 2802 is substantially shorter, for example, at least two times shorter, than the duration of the second pulse 2804. A third voltage pulse 2806 is then applied to read the state of the memory, wherein the third voltage pulse 2806 has an amplitude lower than the set/reset voltage but higher than a holding voltage of the selector. The duration of the third pulse 2806 may be longer than the second pulse 2804. FIG. 28 shows a write-read-verify scheme to verify the write operation as well as save the selector-open pulse.

Figure 29:
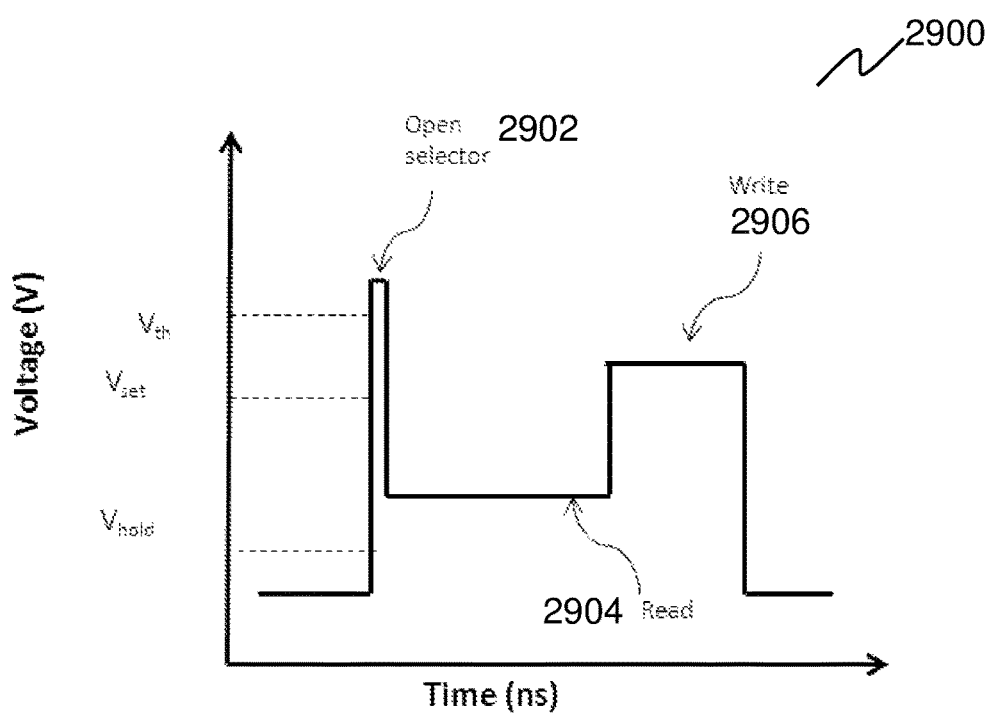
FIG. 29 shows a diagram illustrating an operating scheme according to a memory cell operating method of various embodiments.

FIG. 29 shows a diagram 2900 illustrating an operating scheme according to a memory cell operating method of various embodiments.

As shown in FIG. 29, a first pulse 2902 with an amplitude higher than the threshold voltage is applied to switch on the selector, thereby selecting the memory cell connected with the selector. A second voltage pulse 2904 is subsequently applied to read the memory cell, wherein the second voltage pulse 2904 has an amplitude lower than the set/reset voltage but higher than a holding voltage of the selector. The duration of the first pulse 2902 is substantially shorter, for example, at least two times shorter, than the duration of the second pulse 2904. A third voltage pulse 2906 is then applied to write the memory cell, wherein the third voltage pulse 2906 has an amplitude higher than the set/reset voltage and lower than the threshold voltage. The duration of the third pulse 2906 may be shorter than the second pulse 2904.

FIG. 29 shows a read-write operation scheme for possible energy saving. If the memory state as read by the second pulse 2904 is the same as the state to be written, the write operation of the third pulse 2906 may be stop after the stage of the second pulse 2904. Otherwise, the write operation continues by applying the third pulse 2906.

Figure 30:
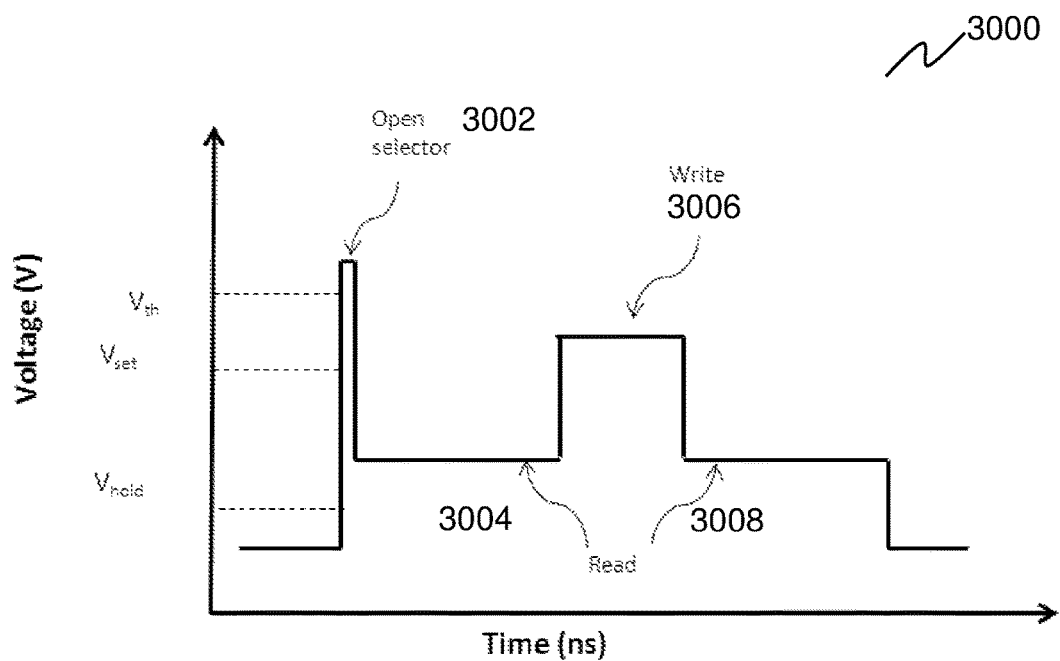
FIG. 30 shows a diagram illustrating an operating scheme according to a memory cell operating method of various embodiments.

FIG. 30 shows a diagram 3000 illustrating an operating scheme according to a memory cell operating method of various embodiments.

As shown in FIG. 30, a first pulse 3002 with an amplitude higher than the threshold voltage is applied to switch on the selector, thereby selecting the memory cell connected with the selector. A second voltage pulse 3004 is subsequently applied to read the memory cell, wherein the second voltage pulse 3004 has an amplitude lower than the set/reset voltage but higher than the holding voltage of the selector. The duration of the first pulse 3002 is substantially shorter, for example, at least two times shorter, than the duration of the second pulse 3004. A third voltage pulse 3006 is then applied to write the memory cell, wherein the third voltage pulse 3006 has an amplitude higher than the set/reset voltage and lower than the threshold voltage. The duration of the third pulse 3006 may be shorter than the second pulse 3004. A fourth pulse 3008 is then applied to read the written state of the memory cell, wherein the fourth pulse 3008 may have similar amplitude and duration as the second pulse 3004.

FIG. 30 shows a read-write-read operation scheme for possible energy saving. If the memory state as read by the second pulse 3004 is the same as the state to be written, the write operation of the third pulse 3006 may be stop after the stage of the second pulse 3004. Otherwise, the write operation continues by applying the third pulse 3006. The write operation is verified by the fourth pulse 3008 which saves the selector-open pulse.

Figure 31:
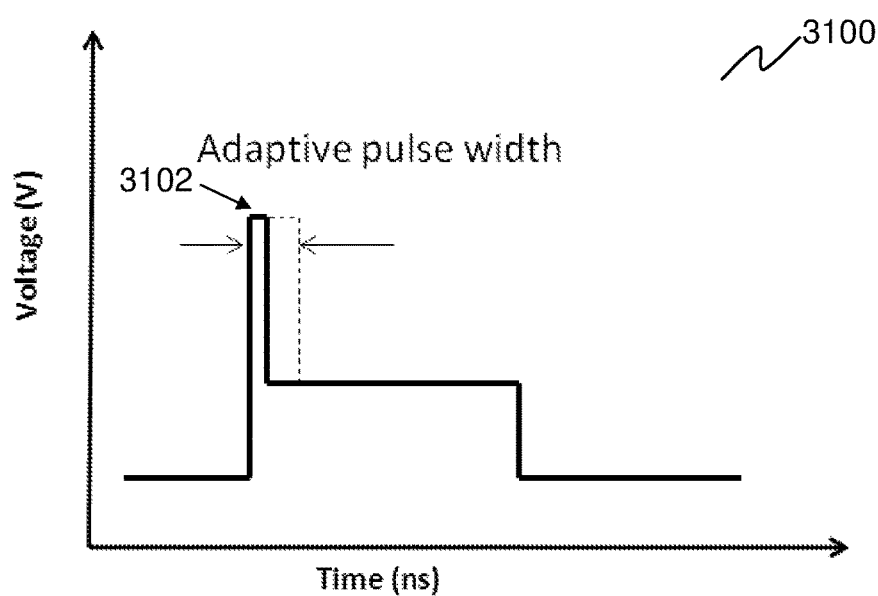
FIG. 31 shows a diagram illustrating an operating scheme according to a memory cell operating method of various embodiments.

FIG. 31 shows a diagram 3100 illustrating an operating scheme according to a memory cell operating method of various embodiments.

As shown in FIG. 31, the duration or pulse width of the first pulse 3102 for switching on the selector device is dynamic, and is adaptively modified by an adaptive pulse generator shown in FIG. 32 below. The adaptive pulse scheme may achieve high selector-on probability while still maintain the minimized short pulse width.

Figure 32:
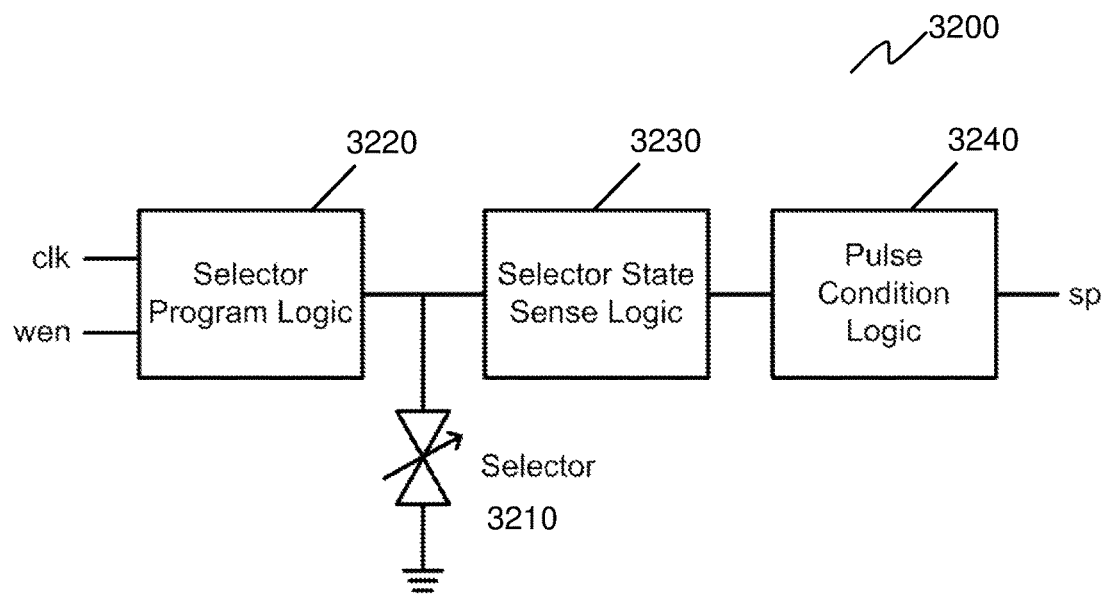
FIG. 32 shows a block diagram of an adaptive selector pulse generator according to various embodiments.

FIG. 32 shows a block diagram 3200 of an adaptive selector pulse generator according to various embodiments.

The adaptive selector pulse generator 3200 may include a selector 3210 to generate a reference pulse width for turning on the selector. A selector program logic 3220 is included to write the selector 3210 based on a clk signal when a wen is activated, wherein the wen signal is a write enable signal generated by a counter logic shown in FIG. 34 below. The wen signal is only asserted during the first clock cycle to avoid repeated programming to the selector to improve reliability. The half cycle time of the clk signal ($0.5t_{clk}$) is longer than the selector's switching time ($t_{sel}$), $0.5t_{clk} > t_{sel}$.

The adaptive selector pulse generator 3200 may include a selector state sense logic 3230 to sense the change of the selector state and determine the pulse end time. When the selector 3210 is switched on, the status change is sensed and indicated by an output signal.

The adaptive selector pulse generator 3200 may further include a pulse condition logic 3240 to add short delays to the output signal of the state sense logic (e.g., to provide headroom that caters for device variation) and create the short pulse sp. The pulse width of sp is dependent on selector's 3210 dynamic characteristic which tracks process and environmental variations and ensures a high turn-on rate of the selector in the memory array.

The added short-delay further adds headroom that caters for selectors with slower response time.

Figure 33:
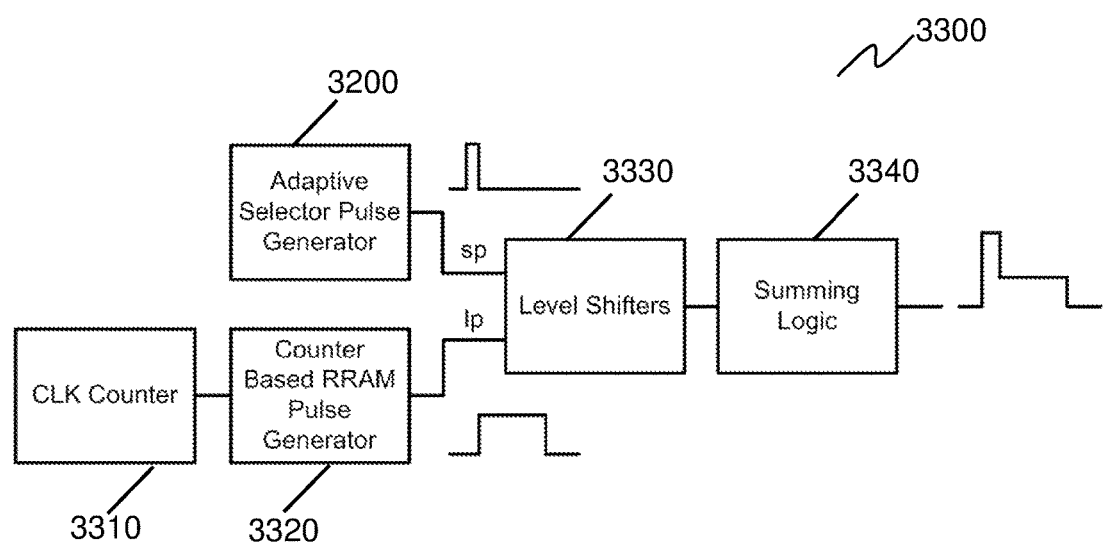
FIG. 33 shows a block diagram of a pulse generator according to various embodiments.

FIG. 33 shows a block diagram 3300 of a pulse generator according to various embodiments.

The pulse generator 3300 may include an adaptive selector pulse generator 3200 of FIG. 32 for generating a short pulse based on the switching characteristics of selector

3210. Pulse width of the generated pulse may match a selector in a memory device/array with process tracking capability.

A CLK counter 3310 is provided, and a counter based RRAM pulse generator 3320 is used to generate a long pulse lp based on the number of clock cycles.

The pulse generator 3300 may include level shifters 3330 to step the amplitude of sp to the threshold voltage $V_{th}$ of selector and the amplitude of lp to either the read voltage $V_{read}$ or write voltage $V_{write}$ of RRAM cell.

A summing logic 3340 is further included to generate the final multi-amplitude pulse, for example, the multi-amplitude pulses shown in FIGS. 22B, 24, 27-31 above.

Figure 34:
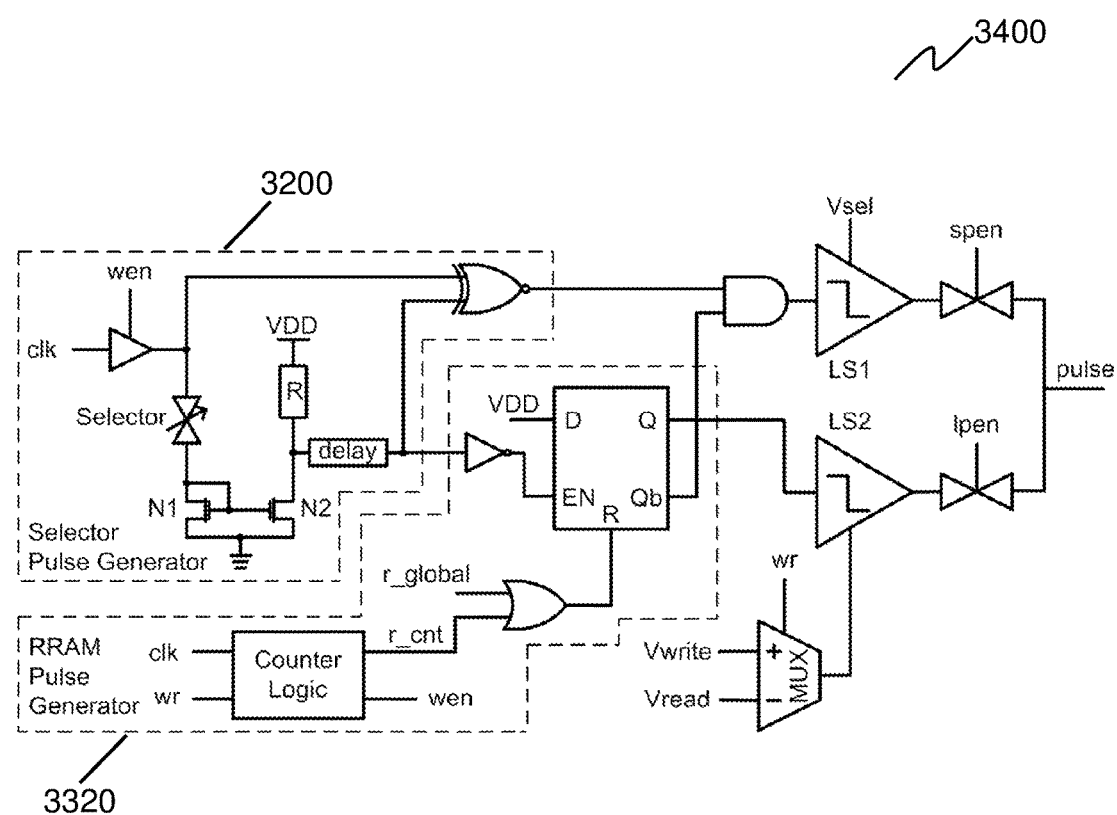
FIG. 34 shows an exemplary circuit diagram of the pulse generator according to various embodiments.

FIG. 34 shows an exemplary circuit diagram 3400 of the pulse generator 3300.

As shown in the selector pulse generator 3200, the wen controlled input buffer programs the selector only during the first clock cycle to avoid unnecessary write to the selector. When the selector is turned on, the selector current is copied by the NMOS current mirror N1-N2 to the next branch where the drain of N2 is connected to VDD through a resistive load R. The drain voltage of the N2 drops from VDD to a value below the trip point of an inverter at time t. The delay element further delays the signal drop till $t_1$. The short pulse for selector is then generated by the XNOR gate. The end of the short pulse which is also the start of the long pulse is captured by the D flip flop (DFF). The voltage of the Q output is set to high when the short pulse ends until the DFF is reset. The reset timing is controlled by the clock counter logic where r_cnt is set to high at the end of the clock number depending on the type of memory operation (write and read) controlled by wr. Signal wr also controls the amplitude of the long pulse through a multiplexer that connects $V_{write}$ or $V_{read}$ to the supply voltage of the second level shifter LS2. While the supply of the first level shifter LS1 is connected to $V_{th}$. The two pulses are integrated together through a pair of transmission gates controlled by spen and lpen, respectively.)

Figure 35:
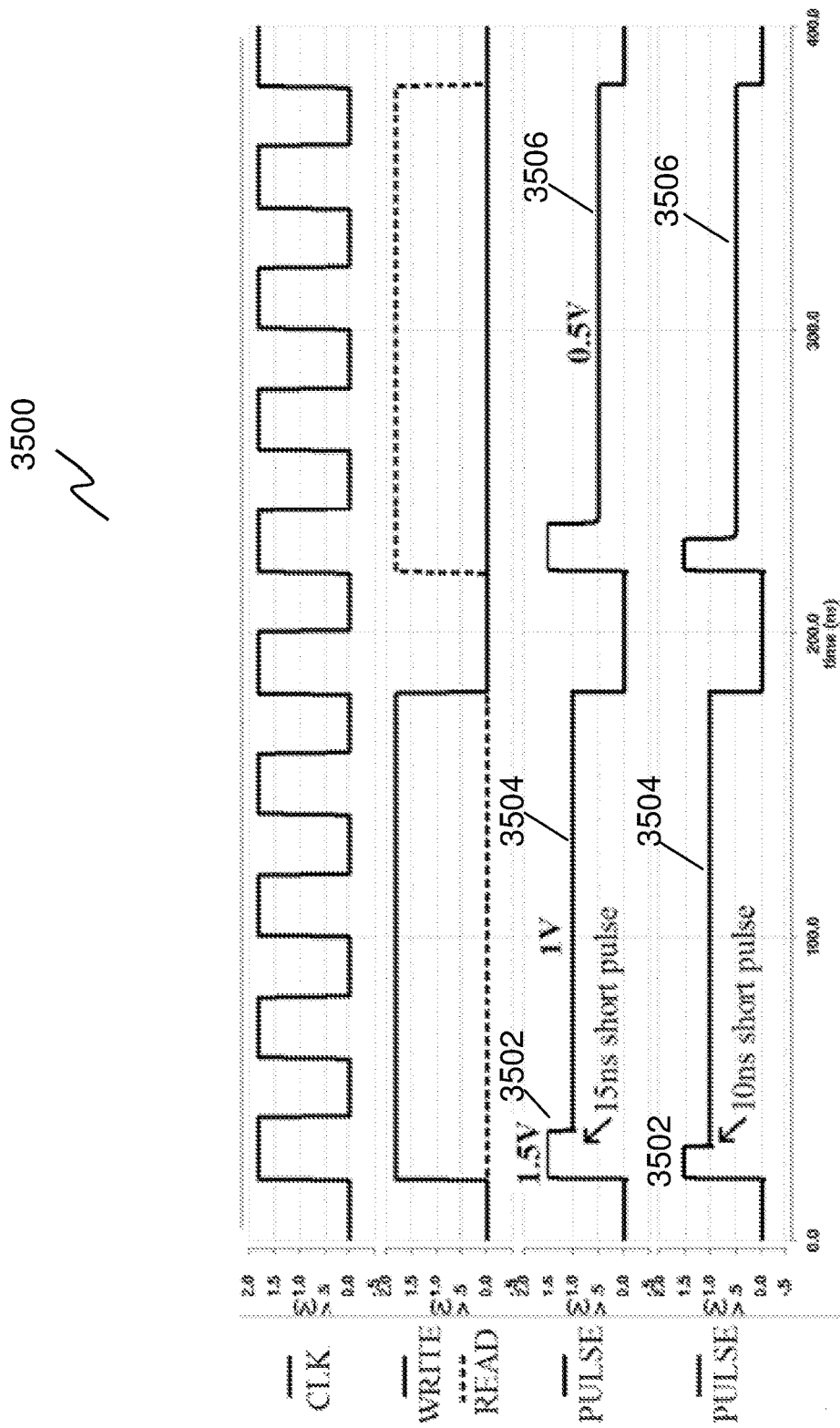
FIG. 35 shows a diagram illustrating simulation results of pulse generation according to various embodiments.

FIG. 35 shows a diagram 3500 illustrating simulation results of pulse generation according to various embodiments. In the simulation of FIG. 35, the frequency of the clock signal $F_{clk}$ may be about 25 MHz, the voltage 3502 for turning on the selector ($V_{th}$) may be about 1.5V, the write voltage $V_{write}$ 3504 may be about 1V, and the read voltage $V_{read}$ 3506 may be about 0.5V. Two pulses are generated with selector switching time of 15 ns and 10 ns, respectively.

Figures 36A, 36B:
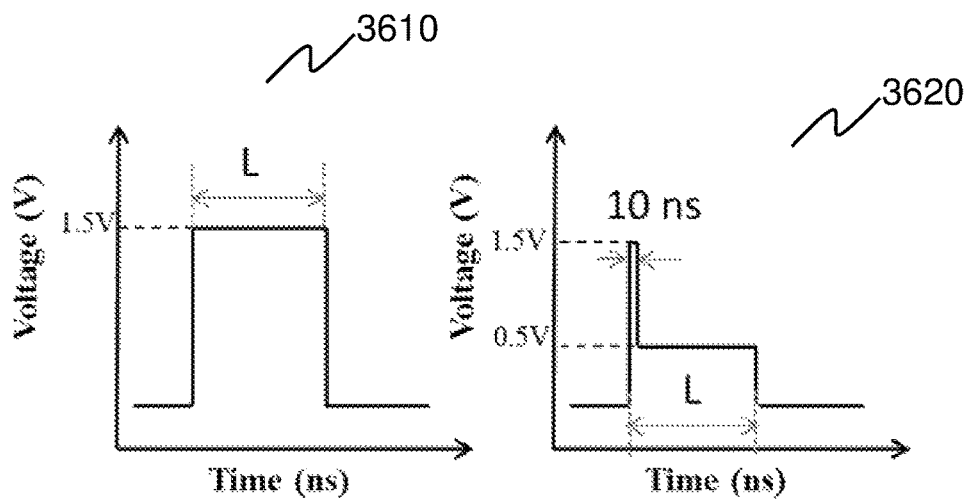
FIG. 36A shows a diagram illustrating a conventional operating scheme.
FIG. 36B shows a diagram illustrating an operating scheme according to a memory cell operation method of various embodiments.

FIG. 36A shows a diagram 3610 illustrating a conventional operating scheme, in which a high reading voltage of 1.5V is needed.

FIG. 36B shows a diagram 3620 illustrating an operating scheme according to a memory cell operation method of various embodiments, in which a low reading voltage of 0.5V is needed.

Figure 36C:
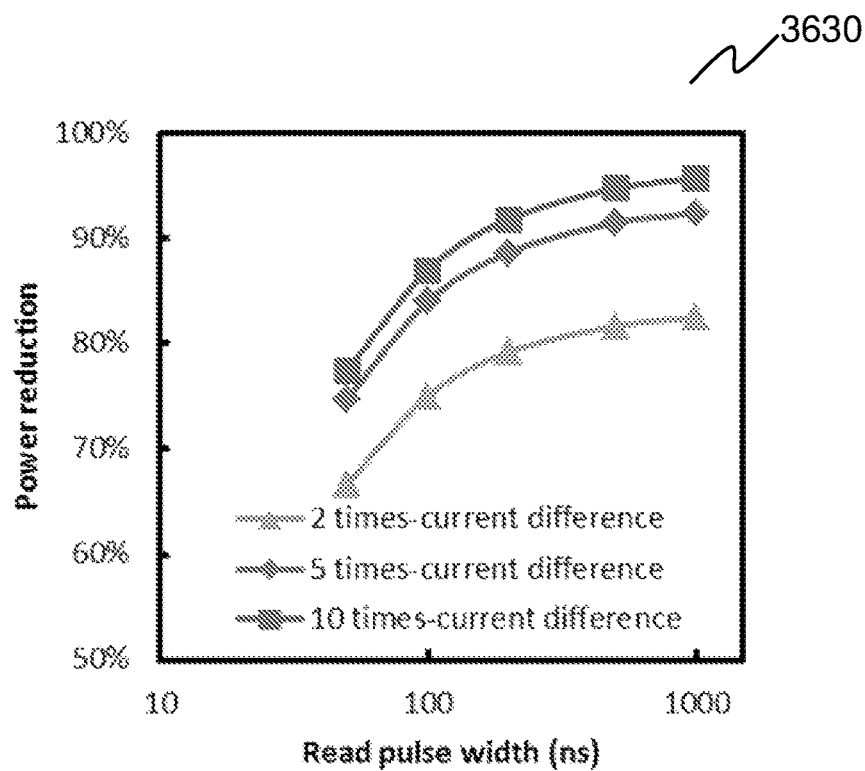
FIG. 36C shows a diagram illustrating the power reduction achieved using various read pulse width according to various embodiments.

FIG. 36C shows a diagram 3630 illustrating the power reduction achieved using various read pulse width according to various embodiments. The current difference (e.g., 2 times difference, 5 times difference and 10 times difference) as shown in FIG. 36C) is the comparison of current reading at 1.5V and 0.5V at RRAM off-state or RRAM on-state. As shown in FIG. 36C, energy saving of up to 90% can be achieved according to the reading operation of various embodiments.

Various embodiments above provide a high current density selector device used for high density non-volatile memory arrays. Various embodiments further provide a method of operating the memory cell to reduce the power consumption during reading and programming.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory device, comprising:
a memory cell;
a selector device for selecting the memory cell, wherein the selector device consists of:
a first electrode;
a second electrode; and
a switching layer sandwiched between the first electrode and the second electrode, the switching layer consisting of a plurality of metal rich layers and a plurality of chalcogenide rich layers;
wherein the metal rich layers and the chalcogenide rich layers are arranged alternately, the plurality of metal rich layers having the same material, and the plurality of chalcogenide rich layers having the same material;
wherein a number of the metal rich layers is same as a number of chalcogenide rich layers;
wherein each metal rich layer of the plurality of metal rich layers comprises at least one of a metal or a metal compound, and wherein metal content of each metal rich layer of the plurality of metal rich layers is greater than 50 at. %;
wherein each chalcogenide rich layer of the plurality of chalcogenide rich layers comprises a mixture comprising a chalcogenide and any one material selected from a group consisting of a dielectric material and a metal material, and wherein chalcogenide content of each chalcogenide rich layer of the plurality of chalcogenide rich layers is greater than 50 at. %; and
a third electrode;
wherein the memory cell is arranged on the second electrode, and the third electrode is arranged on the memory cell.

2. The memory device of claim 1, wherein each of the metal rich layers and each of the chalcogenide rich layers have a thickness in a range of 1nm-20nm.

3. The memory device of claim 1, wherein the metal compound comprises at least one of silver telluride, silver selenide, silver sulfide, copper telluride, copper selenide, or copper sulfide.

4. The memory device of claim 1, wherein the metal comprised in the metal rich layers comprises at least one of silver, copper, platinum, zinc, gold, ruthenium, or lithium.

5. The memory device of claim 1, wherein the metal content of the metal rich layers is substantially equal to 100 at. %.

6. The memory device of claim 5, wherein the material of the metal rich layers is different from a material of the first electrode and a material of the second electrode.

7. The memory device of claim 1, wherein the chalcogenide is a metalloid chalcogenide selected from germanium telluride, antimony telluride, germanium antimony telluride, germanium selenide, germanium sulfide, germanium oxide, germanium antimony, or antimony sulfide.

8. The memory device of claim 1, wherein the chalcogenide is a metal chalcogenide selected from silver telluride, silver selenide, silver sulfide, copper telluride, copper selenide, or copper sulfide.

* * * * *